United States Patent
Sekiguchi et al.

(10) Patent No.: US 11,508,436 B2
(45) Date of Patent: Nov. 22, 2022

(54) MEMORY DEVICE

(71) Applicants: Sharp Semiconductor Innovation Corporation, Tenri (JP); TOHOKU UNIVERSITY, Sendai (JP)

(72) Inventors: Yoshihisa Sekiguchi, Fukuyama (JP); Tetsuo Endoh, Sendai (JP)

(73) Assignees: Sharp Semiconductor Innovation Corporation, Tenri (JP); TOHOKU UNIVERSITY, Sendai (JP)

( * ) Notice: Subject to any disclaimer, the term of this patent is extended or adjusted under 35 U.S.C. 154(b) by 108 days.

(21) Appl. No.: 17/037,492

(22) Filed: Sep. 29, 2020

(65) Prior Publication Data
US 2022/0101916 A1 Mar. 31, 2022

(51) Int. Cl.
*G11C 11/16* (2006.01)
*G11C 13/00* (2006.01)

(52) U.S. Cl.
CPC ........ *G11C 13/004* (2013.01); *G11C 11/1657* (2013.01); *G11C 11/1659* (2013.01); *G11C 11/1673* (2013.01); *G11C 13/003* (2013.01); *G11C 13/0028* (2013.01); *G11C 2013/0054* (2013.01); *G11C 2213/79* (2013.01)

(58) Field of Classification Search
CPC .............. G11C 13/004; G11C 11/1657; G11C 11/1659; G11C 11/1673; G11C 13/0028; G11C 13/003; G11C 2013/0054; G11C 2213/79
See application file for complete search history.

(56) References Cited

U.S. PATENT DOCUMENTS

| | | | |
|---|---|---|---|
| 7,335,906 B2* | 2/2008 | Toda | G11C 7/18 257/3 |
| 2003/0058727 A1* | 3/2003 | Tanizaki | G11C 11/4094 365/230.03 |
| 2004/0233696 A1 | 11/2004 | Kang | |
| 2012/0195121 A1* | 8/2012 | Torii | H01L 27/11529 365/185.05 |
| 2013/0094277 A1* | 4/2013 | Rho | G11C 13/0026 365/148 |
| 2014/0281189 A1 | 9/2014 | Noguchi et al. | |
| 2018/0158526 A1* | 6/2018 | Kim | H01L 43/12 |

FOREIGN PATENT DOCUMENTS

| | | |
|---|---|---|
| JP | 2001057096 A | 2/2001 |
| JP | 2002367390 A | 12/2002 |
| JP | 2003141881 A | 5/2003 |
| JP | 2004348937 A | 12/2004 |
| JP | 2014-179150 A | 9/2014 |

* cited by examiner

*Primary Examiner* — Hien N Nguyen
(74) *Attorney, Agent, or Firm* — ScienBiziP, P.C.

(57) ABSTRACT

A memory device includes: a cell array that includes a first region including first memory cells and a second region including second memory cells; first word lines connected to each of the first memory cells; second word lines connected to each of the second memory cells; a first bit line commonly connected to the first memory cells and the second memory cells; a row decoder that selects one of the first word lines and one of the second word lines in parallel during a data read operation; and a sense amplifier between the first region and the second region and electrically connected to the first bit line during the data read operation.

22 Claims, 17 Drawing Sheets

MEMORY DEVICE

BACKGROUND OF THE INVENTION

1. Field

The present disclosure relates to a memory device.

2. Description of the Related Art

Currently, in many information processing devices such as processors and microcomputers, memories are hierarchized and used in order to improve efficiency of information processing. However, as an amount of data to be handled increases and a memory capacity increases, a data movement between memory hierarchies and data management cause an increase in power consumption, and a reduction in power consumption of the memory is demanded.

Under such circumstances, in recent years, various proposals are made to use various resistance-change type memories as a technique for supporting the memory. Specifically, a magnetoresistive random access memory (MRAM), a resistive random access memory (ReRAM), a phase change random access memory (PCRAM), and the like, that can hold data in a small area in a non-volatile manner, are put into practical use. When these memories are installed, an array structure is formed in which a plurality of word lines and a plurality of bit lines are arranged in a matrix and memory cells each including a select transistor and a resistance change element are arranged at an intersection of each word line and bit line of the plurality of word lines and bit lines.

However, an operating speed of the resistance-change type memory may be inferior to that of the DRAM or SRAM. Accordingly, structures for realizing a high-speed operation of the resistance-change type memory are being studied. As one of the structures, for example, in the configuration disclosed in Japanese Patent Application Publication No 2014-179150, a set of a plurality of memory cells connected to a plurality of word lines is used as a unit of stored information. For example, in the 4T-4MTJ mode described in Japanese Patent Application Publication No 2014-179150, the unit of stored information is a set of four memory cells arranged in two rows and two columns. In this case, it is demanded that two word lines are selected at the same time during a data read operation.

In a memory having such a structure, the larger the number of memory cells serving as a unit of stored information, the higher the operating speed, reliability, and the like, but on the other hand, it is disadvantageous in increasing the capacity. In the memory structure which is hierarchically formed as described above, the operating speed and the data capacity are often different for each hierarchy, and in a normal case, the data capacity of the upper-level hierarchy memory is smaller than that of the lower-level hierarchy memory and the demanded operating speed is faster in the upper-level hierarchy memory. Accordingly, it is desirable to assign a mode in which more memory cells are used to the upper-level hierarchy memory.

SUMMARY

According to an aspect of the disclosure, there is provided a memory device including a cell array that includes a first region including a plurality of first memory cells and a second region including a plurality of second memory cells, a plurality of first word lines connected to each of the plurality of first memory cells, a plurality of second word lines connected to each of the plurality of second memory cells, a first bit line commonly connected to the plurality of first memory cells and the plurality of second memory cells, a row decoder that selects one of the first word lines and one of the second word lines in parallel according to a row address during a data read operation, and a sense amplifier provided between the first region and the second region and electrically connected to the first bit line during the data read operation.

DETAILED DESCRIPTION OF THE EMBODIMENTS

Hereinafter, embodiments of the present disclosure will be described with reference to the accompanying drawings. In the figures, the same or equivalent elements will be denoted by the same reference symbols, and redundant descriptions thereof will be omitted.

First Embodiment

Figure 1:
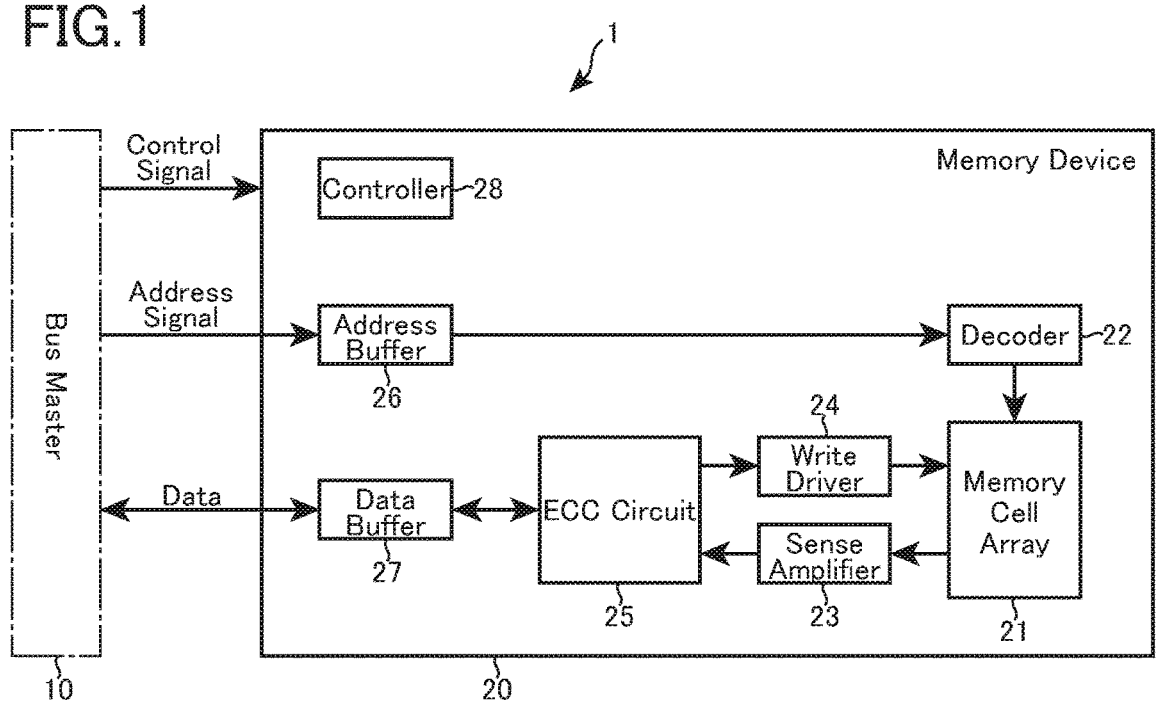
FIG. 1 is a block diagram of a processor system according to a first embodiment of the present disclosure.

A memory device according to a first embodiment of the present disclosure will be described.
<<Configuration>>
First, a configuration of the memory device according to this embodiment will be described with reference to FIG. 1. FIG. 1 is a block diagram of, for example, a processor system 1 according to this embodiment.

As illustrated, the processor system 1 includes a bus master 10 and a memory device 20, both of which are communicably connected to each other via a bus. The bus master 10 is, for example, a processor such as a CPU or a DMA controller. The bus master 10 instructs the memory device 20 to write or read data. The memory device 20 is, for example, a resistance-change type non-volatile memory, and is an STT-MRAM in this example. The memory device 20 functions as a cache memory or a main memory of the processor, for example.

The bus master 10 transmits a control signal and an address to the memory device 20, and also transmits write data to the memory device 20 during writing. The memory device 20 operates according to a signal received from the bus master 10, stores received write data during writing, and transfers data read from a designated address to the bus master 10 during the data read operation.

Next, details of the configuration of the memory device 20 will be described. As illustrated in FIG. 1, the memory device 20 includes a memory cell array 21, a decoder (row decoder and column decoder) 22, a sense amplifier (and column selector) 23, a write driver 24, an error checking and correcting (ECC) circuit 25, an address buffer 26, a data buffer 27, and a controller 28.

The memory cell array 21 includes a plurality of memory cells. The memory cells are arranged in a matrix and associated with rows and columns. Then, the memory cells store data in a non-volatile manner. Details of the configuration of the memory cell array 21 will be described later with reference to FIGS. 2 and 3.

The address buffer 26 holds an address (row address and column address) of the memory cell array 21 received from the bus master 10 during a data read operation and a data write operation.

The decoder 22 decodes the address received from the address buffer 26. Then, the decoder 22 selects a row direction and a column direction in the memory cell array 21 based on the decoding result. With this configuration, the memory cell which is a write target or a read target is selected. In the following, of the decoder 22, a unit that decodes a row address and selects the row direction is referred to as a row decoder 22A, and a unit that decodes a column address and selects the column direction is referred to as a column decoder 22B.

The sense amplifier 23 reads data from a selected memory cell, senses and amplifies the read data. The sense amplifier 23 includes a unit that selects any column based on the decoding result of the column decoder 22B. When distinguishing these units, each unit is referred to as a sense amplifier 23A and a column selector 23B.

The write driver 24 applies a voltage or supplies a current to the selected memory cell based on write data. With this configuration, data is written into the selected memory cell.

The ECC circuit 25 executes ECC processing on read data and write data. The ECC circuit 25 generates a redundant bit (for example, parity) based on the write data during the data write operation. Then, the generated parity is added to the write data, and this write data with parity is transferred to the write driver 24. During the data read operation, the read data is received from the sense amplifier 23. Then, the ECC circuit 25 generates a syndrome based on the received read data and detects an error. Then, when an error is detected, the ECC circuit 25 corrects the error.

The data buffer 27 holds write data to the memory cell received from the bus master 10 and transfers the write data to the ECC circuit 25. The data buffer 27 holds read data whose error is corrected in the ECC circuit 25 and transfers the read data to the bus master 10.

The controller 28 controls the operation of the entire memory device 20.

Figure 2:
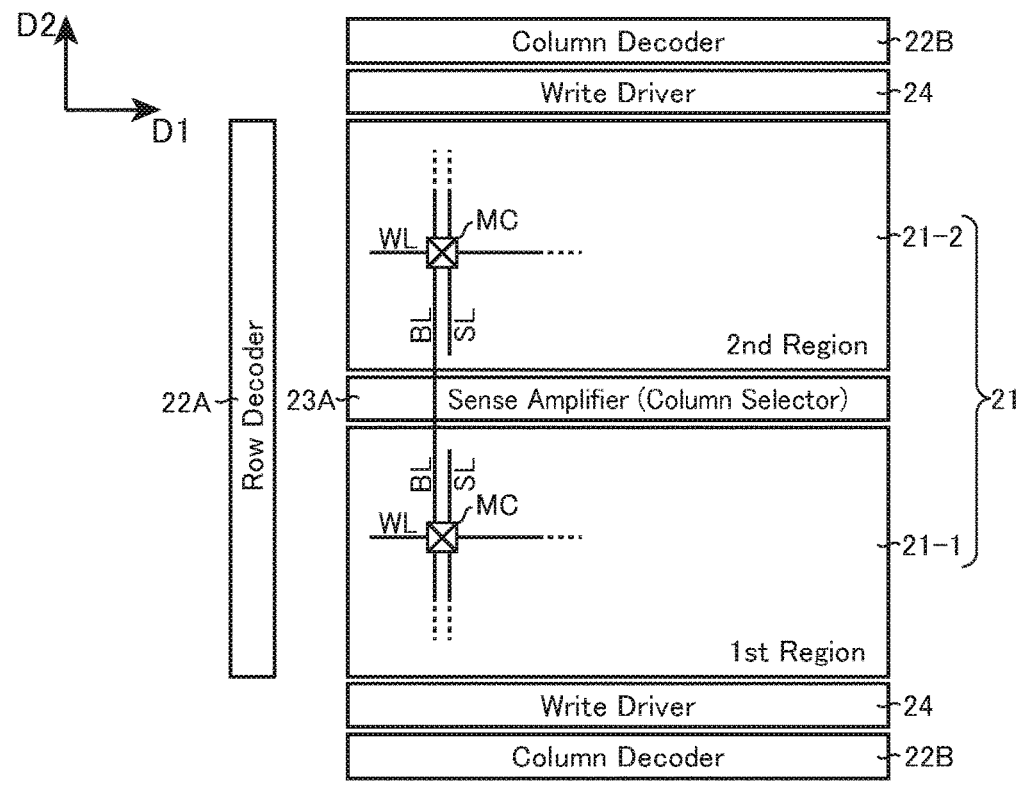
FIG. 2 is a layout diagram of a partial region of a memory device according to the first embodiment of the present disclosure.

FIG. 2 illustrates a planar layout of the memory cell array 21, the row decoder 22A, the column decoder 22B, the sense amplifier 23A, and the write driver 24 according to this embodiment. As illustrated, the memory cell array 21 includes a first region 21-1 and a second region 21-2. The memory cell array 21 includes memory cells MC each of which is connected to a word line WL along a first direction D1 and a bit line BL and a source line SL along a second direction D2 different from (which is orthogonal to, in this example) the first direction D1. The first region 21-1 and the second region 21-2 are arranged along the second direction D2, and the sense amplifier 23A is provided between the first and second regions 21-1 and 21-2. Bit lines BL pass above the sense amplifier 23A and are commonly connected to each other, between the first region 21-1 and the second region 21-2. Then, for example, in the region between the first region 21-1 and the second region 21-2, each bit line BL is electrically connected to the sense amplifier 23A through a contact plug. On the other hand, each of the source lines SL of the first region 21-1 and each of the source lines SL of the second region 21-2 are physically separated from each other, in the region between the first region 21-1 and the second region 21-2.

The write driver 24 is provided so as to be adjacent to each of the first region 21-1 and the second region 21-2 in the second direction D2. The column decoder 22B is provided so as to be adjacent to the write driver 24 in the second direction D2. The row decoder 22A is provided so as to be adjacent to the memory cell array 21 in the first direction D1.

Figure 3:
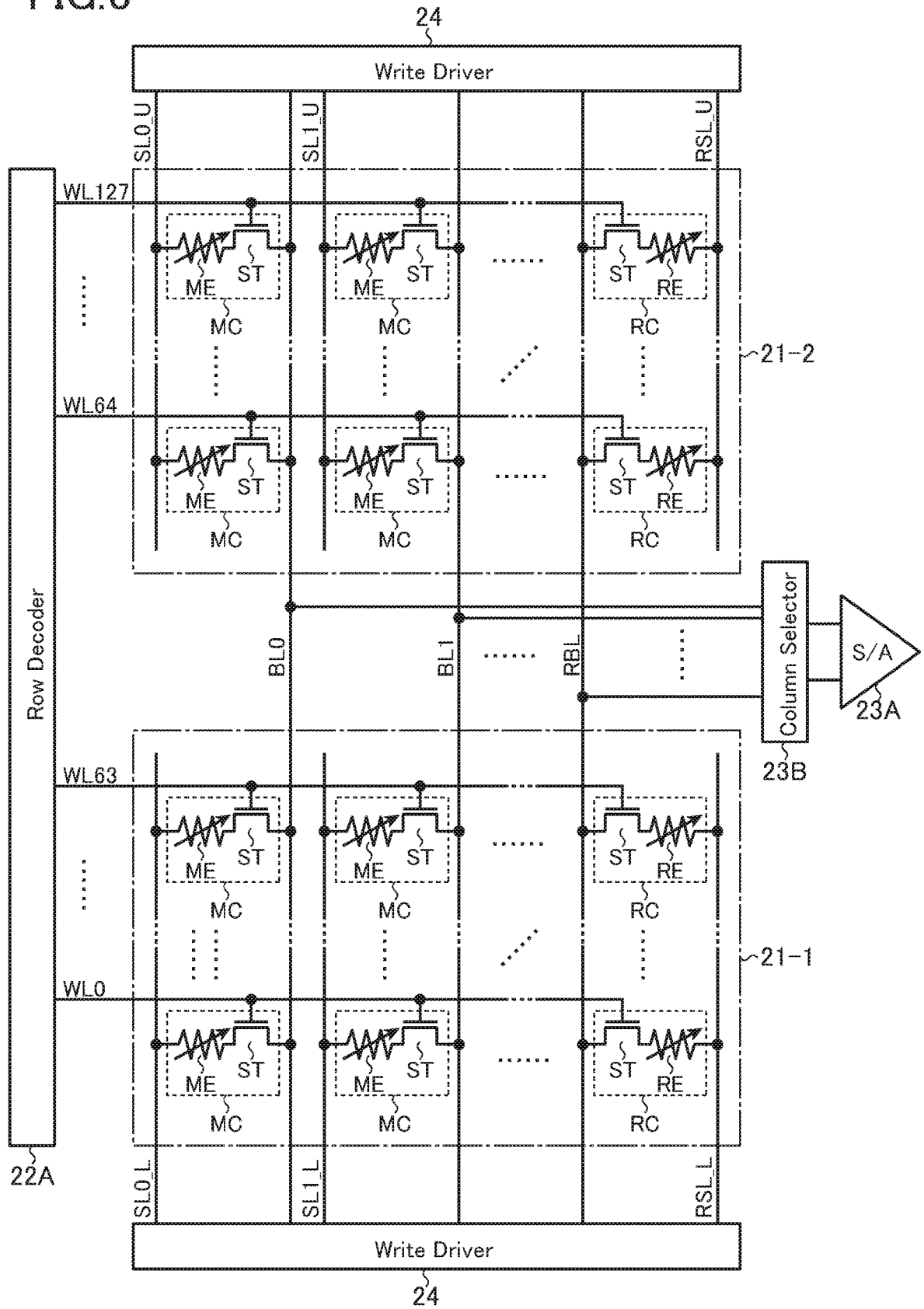
FIG. 3 is a circuit diagram of a memory cell array according to the first embodiment of the present disclosure.

FIG. 3 is a circuit diagram of a partial region of the memory cell array 21 according to this embodiment. As illustrated, each of the first region 21-1 and the second region 21-2 of the memory cell array 21 includes a plurality of memory cells MC arranged in a matrix. Each memory cell MC includes a select transistor ST and a memory element ME. The select transistor ST is, for example, a MOS transistor. The memory element ME is a variable resistance element, and is an MTJ element in this example. Then, a source of the select transistor ST is connected to one end of the memory element ME.

Each of the first region 21-1 and the second region 21-2 includes N (N is a natural number of 1 or more, for example, 64 in this example) word lines WL and L (L is a natural number of 1 or more, for example, 1024 in this example) bit lines BL and source lines SL.

Then, in the first region 21-1, gates of the select transistors ST of the memory cells MC in the same row are commonly connected to the same word lines WL0 to WL63. Drains of the select transistors ST of the memory cells MC in the same column are commonly connected to the same bit lines BL0 to BL1023. Furthermore, the other ends of the memory elements ME of the memory cells MC in the same column are commonly connected to the same source lines SL0 to SL1023.

In the second region 21-2, the gates of the select transistors ST of the memory cells MC on the same row are commonly connected to the same word lines WL64 to WL127. Drains of the select transistors ST of the memory cells MC in the same column are commonly connected to the same bit lines BL0 to BL1023. Furthermore, the other ends of the memory elements ME of the memory cells MC in the same column are commonly connected to the same source lines SL0 to SL1023.

Furthermore, each of the first region 21-1 and the second region 21-2 includes N reference cells RC. Each reference cell RC includes a select transistor ST and a reference element RE. The select transistor ST is, for example, a MOS transistor. The reference element RE has a resistance value that serves as a reference when determining the data held in the memory cell MC. Then, the source of the select transistor ST is connected to one end of the reference element RE. A specific example of the reference element RE will be described later with reference to FIG. 4.

Furthermore, each of the first region 21-1 and the second region 21-2 includes a reference bit line RBL and a reference source line RSL. Then, in the first region 21-1, N reference cells RC are respectively connected to the word lines WL0 to WL63, the drains of the select transistors ST are commonly connected to the reference bit line RBL, and the other ends of the reference elements RE are commonly connected to the reference source line RSL. Similarly, in the second region 21-2, N reference cells RC are respectively connected to the word lines WL64 to WL127, the drains of the select transistors ST are commonly connected to the reference bit line RBL, and the other ends of the reference elements RE are commonly connected to the reference source line RSL.

As described above, the bit lines BL and the reference bit line RBL are commonly connected to the first region 21-1 and the second region 21-2. On the other hand, the source lines SL and the reference source line RSL are physically separated in a region between the first region 21-1 and the second region 21-2. Accordingly, hereinafter, when each source line SL and the reference source line RSL are distinguished from each other in the first region 21-1 and the second region 21-2, the source line and the reference source line are respectively referred to as the source line SL_L and the reference source line RSL_L in the first region 21-1, and are respectively referred to as the source line SL_U and the reference source line RSL_U in the second region 21-2.

In the configuration described above, each word line WL is selected by the row decoder 22A during the data write operation and the data read operation. A voltage is applied to the selected word line WL by the row decoder 22A, and the select transistors ST connected to the selected word line WL are turned ON.

During the data read operation, one of the bit lines BL and the reference bit line RBL are selected by the column selector 23B and connected to the sense amplifier 23A. Then, the sense amplifier 23A determines data by comparing the potential (or current) of the selected bit line BL and the potential (or current) of the reference bit line RBL.

The memory element ME of the memory cell MC is, for example, an MTJ element. The MTJ element includes, for example, two ferromagnetic films and a tunnel insulating film between the two ferromagnetic films. One of the ferromagnetic films is a fixed layer (also referred to as a reference layer) whose magnetization direction is fixed. The other ferromagnetic film is a free layer (also referred to as a storage layer) whose magnetization direction can be changed by a current. When the magnetization directions of the two ferromagnetic films are parallel, a resistance value between the bit line BL and the source line SL in the memory cell MC is small. In contrast, when the magnetization directions of the two ferromagnetic films are antiparallel, the resistance value between the bit line BL and the source line SL is large. The MTJ element holds "0" data and "1" data by utilizing this change in resistance value.

Figure 4:
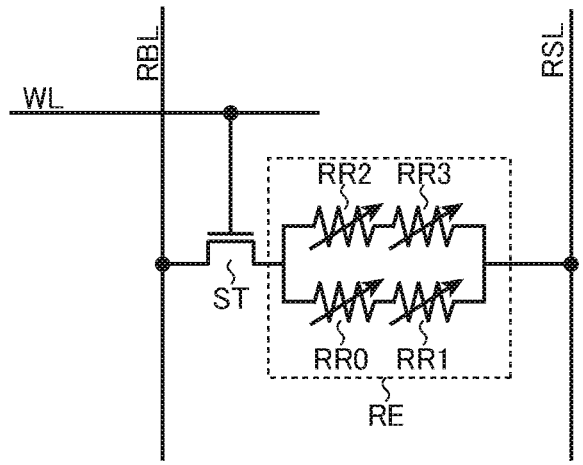
FIG. 4 is a circuit diagram of a reference cell according to the first embodiment of the present disclosure.

The reference cell RC has, for example, a resistance value between an electric resistance value of the MTJ element holding "0" data and a resistance value of the MTJ element holding "1" data. FIG. 4 is a circuit diagram of the reference cell RC according to this embodiment. As illustrated, the reference element RE includes, for example, four storage elements RR0 to RR3. The storage elements RR0 to RR3 are MTJ elements, for example. The storage elements RR0 and RR1 are connected in series, the storage elements RR2 and RR3 are connected in series, and a set of storage elements RR0 and RR1 and a set of storage elements RR2 and RR3 are connected in parallel. For example, the storage elements RR0 and RR2 are in a high resistance state (the magnetization directions are antiparallel), and the storage elements RR1 and RR3 are in a low resistance state (the magnetization directions are parallel). Therefore, a resistance value RREF of the reference element RE is as follows.

$$RREF=(RH+RL)/2$$

However, RH is the resistance value of the storage element RR in the high resistance state, and RL is the resistance value of the storage element RR in the low resistance state. The resistance value RREF is a value between the resistance value of the MTJ element holding "0" data and the resistance value of the MTJ element holding "1" data. The configuration of the reference cell RC is not limited to that illustrated in FIG. 4.

In the configuration described above, data is held by a set of two memory cells MC selected by two word lines WL and one bit line BL, in this embodiment. Hereinafter, such an operation mode is referred to as a 2T-2R(B) mode.

<<Operation>>

Figure 5:
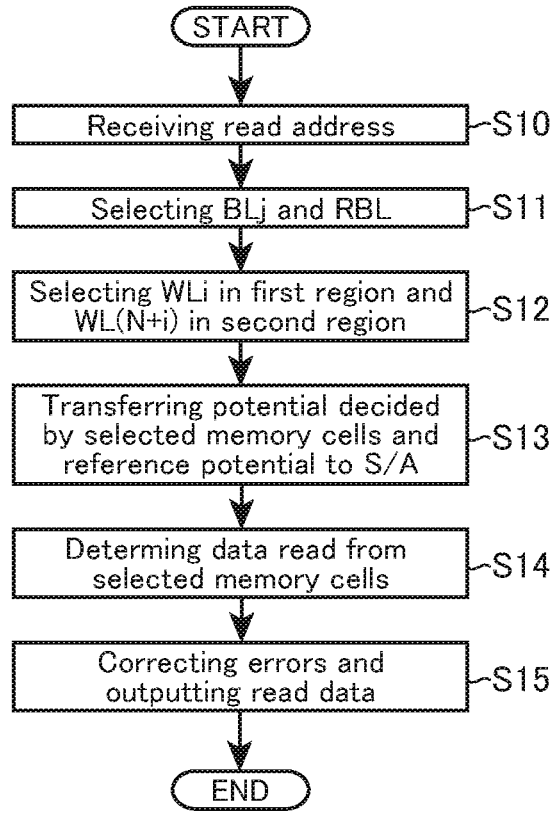
FIG. 5 is a flowchart of a data read operation according to the first embodiment of the present disclosure.

Next, a method of reading data in the 2T-2R(B) mode according to this embodiment will be described. FIG. 5 is a flowchart of a data read operation according to this embodiment.

As illustrated, the memory device 20 first receives an address ADD targeted for reading from the bus master 10 and holds the address ADD in the address buffer 26 (step S10). Subsequently, the address ADD is decoded by the decoder 22.

Then, the column selector 23B selects one of the bit lines BLj (j is 0 to (L−1), which is 0 to 1023 in this example) and the reference bit line RBL based on the decoding result of the column address (step S11). In this case, similarly, the source lines SLj and the reference source line RSL are also selected, and these source lines and reference source line are grounded in the write driver 24. The row decoder 22A selects one of the word lines WLi (i is 0 to (N−1), which is 0 to 63 in this example) and the word line WL(i+N) based on the decoding result of the row address (step S12).

Then, the selected bit line BLj and the reference bit line RBL are charged, and a current flows through the selected bit line BLj and the reference bit line RBL. Then, the potential determined by the current flowing through the selected bit line BLj and the reference bit line RBL is transferred to the sense amplifier 23A (step S13). The sense amplifier 23A determines whether the data held in the selected memory cell MC is "0" or "1" based on the potentials of the selected bit line BLj and the reference bit line RBL (step S14). After that, error detection and error correction are performed on the read data in the ECC circuit 25, and the data is further transferred to the bus master 10 via the data buffer 27 (step S15).

Figure 6A:
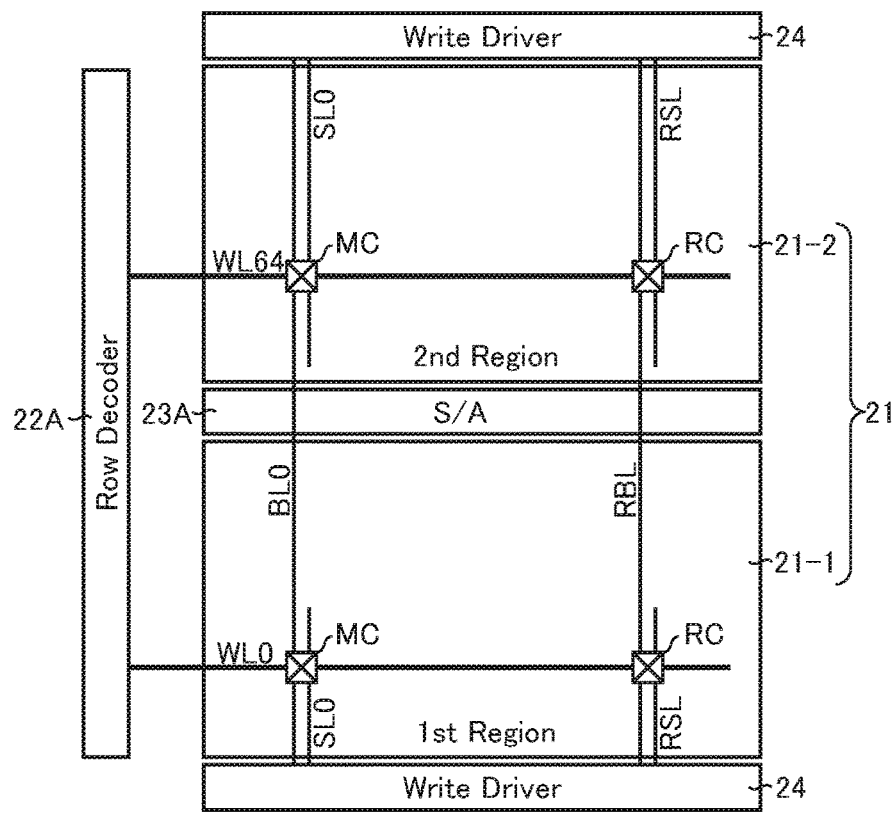
FIG. 6A is a conceptual diagram illustrating how a word line is selected during the data read operation according to the first embodiment of the present disclosure.
Figure 6B:
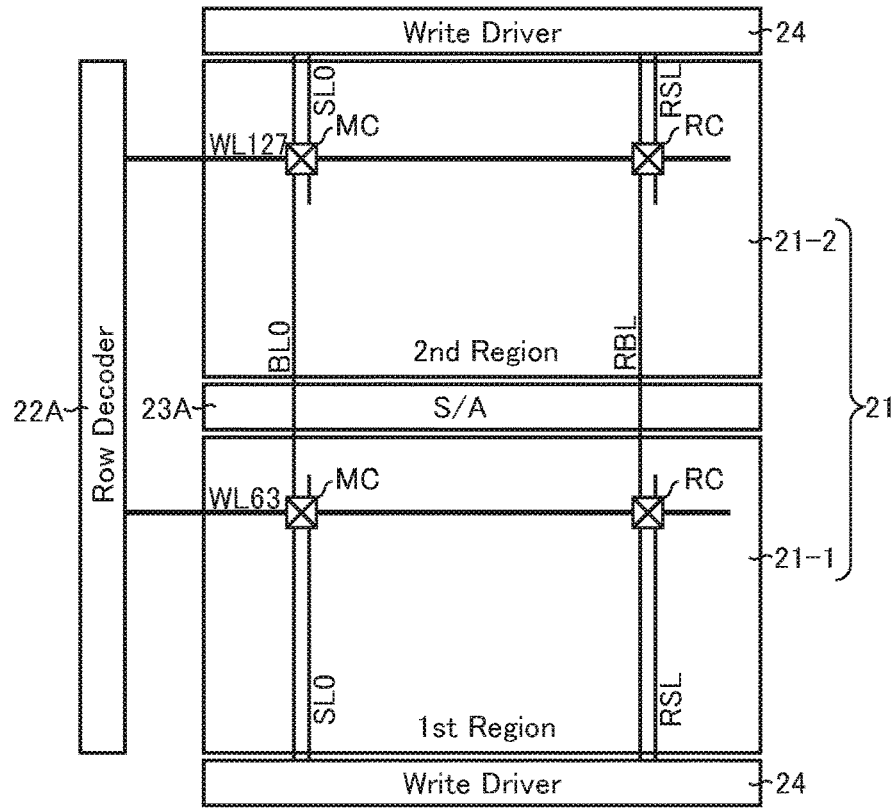
FIG. 6B is a conceptual diagram illustrating how a word line is selected during the data read operation according to the first embodiment of the present disclosure.

A brief description will be given of how the word line WL is selected during the data read operation, with reference to FIGS. 6A and 6B. FIGS. 6A and 6B are block diagrams of a partial region of the memory device 20, and particularly focus on the selected word line WLi, the selected bit line BLj, the selected source line SLj, the reference bit line RBL, and the reference source line RSL.

FIG. 6A illustrates a case where the bit line BL0 is selected and further the word line WL0 is selected in the first region 21-1. In this case, WL(0+64)=WL64 is selected in the second region 21-2. That is, data is read to the bit line BL0 from the two memory cells MC connected to the bit line BL0 and the word lines WL0 and WL64. In other words, data is stored by the set of the two memory cells MC. In parallel with this, data is read to the reference bit line RBL from the two reference cells RC connected to the reference bit line RBL and the word lines WL0 and WL64.

FIG. 6B illustrates a case where the word line WL63 is selected in the first region 21-1 in FIG. 6A. In this case, WL(63+64)=WL127 is selected in the second region 21-2. That is, data is read to the bit line BL0 from the two memory cells MC connected to the bit line BL0 and the word lines WL63 and WL127. In other words, data is stored by the set of the two memory cells MC. In parallel with this, data is read to the reference bit line RBL from the two reference cells RC connected to the reference bit line RBL and the word lines WL63 and WL127.

<<Effects of this Embodiment>>

According to this embodiment, memory regions (first region 21-1 and second region 21-2) are provided in line symmetry with respect to the sense amplifier 23A. Then, during a data read operation, the word line WLi in the first region 21-1 and the word line WL(N+i) in the second region 21-2 are selected. Accordingly, the data read operation can be speeded up and stabilized. This effect will be described below.

Figure 7:
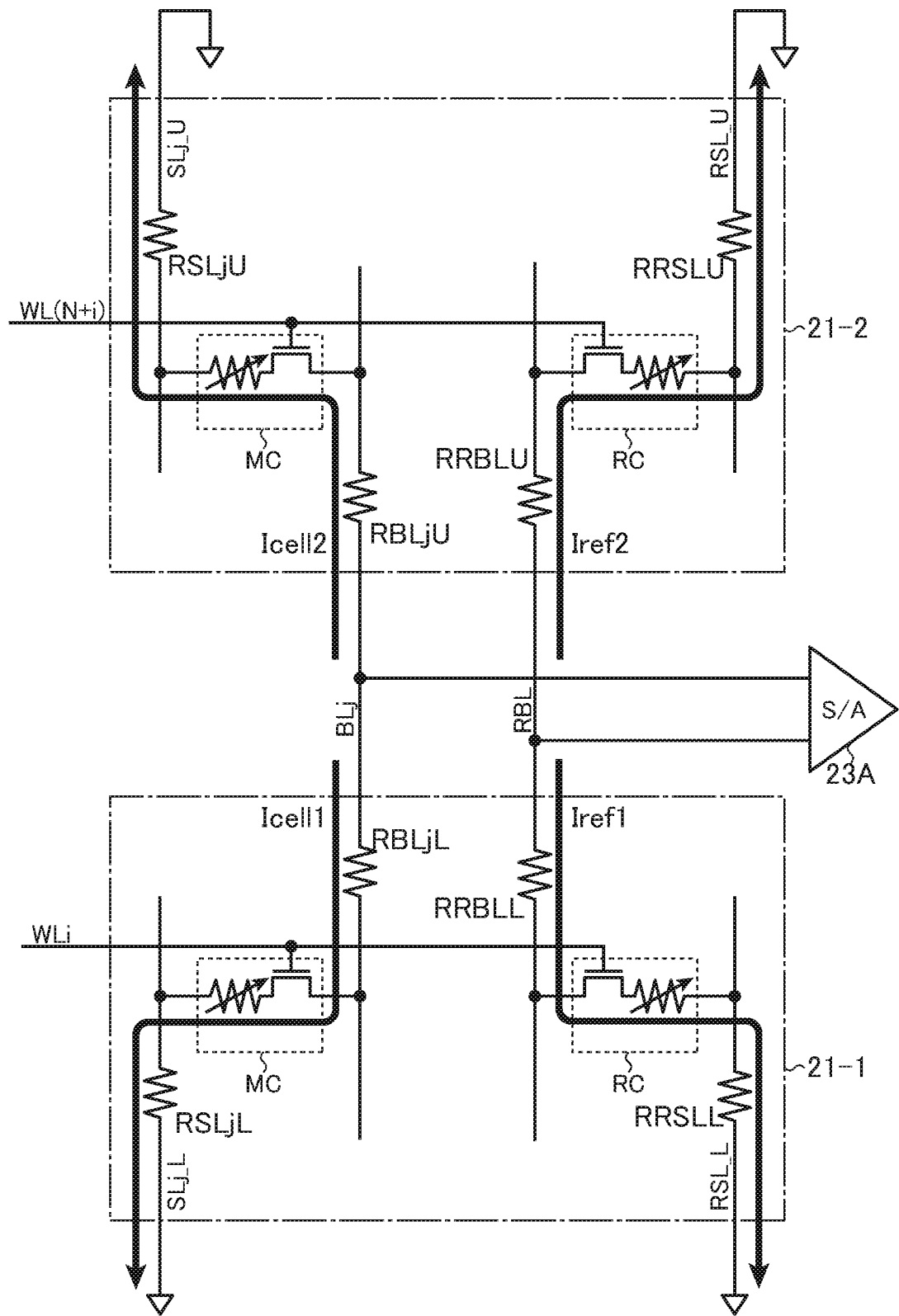
FIG. 7 is a conceptual diagram of a current path during the data read operation according to the first embodiment of the present disclosure.

According to this embodiment, the two word lines WLi and WL(N+i) are selected so that a wiring resistance (interconnects resistance) of the bit line BLj in a current path from the sense amplifier 23A to the memory cell MC becomes substantially constant regardless of the address. This state is illustrated in FIG. 7. FIG. 7 is a schematic diagram illustrating cell currents Icell1 and Icell2 flowing through the selected memory cells MC when the bit line BLj and the reference bit line RBL and the word lines WLi and WL(N+i) are selected, reference currents Iref1 and Iref2 flowing through the selected reference cells RC, and the wiring resistance.

As illustrated, both the first region 21-1 and the second region 21-2 include N word lines WL. Then, when the word line WLi is selected in the first region 21-1, the word line WL(N+i) is selected in the second region 21-2. In this case, the wiring resistance RBLjL of the bit line BLj on the first region 21-1 side and the wiring resistance RBLjU of the bit line BLj on the second region 21-2 side are as follows.

$RBLjL = R(BL)/d \times i$ $RBLjU = R(BL)/d \times (N-i+1)$

However, R(BL) is the wiring resistance per unit length of the bit line BL, and d is the word line pitch. Accordingly, the total wiring resistance RBLtotal is as follows.

$RBLtotal = RBLjL + RBLjU = R(BL)/d \times (N+1)$

That is, the wiring resistance is almost constant regardless of the positions of the two selected word lines WL. In other words, no matter which row address is selected, a parasitic resistance in a path through which the cell current and the reference current flow is averaged. As a result, a position dependency of the wiring resistance during the data read operation is reduced, which contributes to stabilization of the data read operation.

In particular, when the sense amplifier 23A reads data of the memory cells MC arranged in a matrix, the wiring resistance of the bit line BLj affects an SN ratio of the signal during the data read operation. In this respect, according to this embodiment, the wiring resistance of the bit line BLj can be reduced and a sufficient SN ratio can be secured. Furthermore, since the position dependency of the wiring resistance of the bit line BL can be almost ignored, the operation margin for the read time can be suppressed to be small and high-speed operation can be performed.

The wiring resistance for the selected bit line BLj is the same for the wiring resistances RRBLL and RRBLU for the reference bit line RBL.

The same applies to the source line SL. A wiring resistance RSLjL of the source line SLj on the first region 21-1 side and a wiring resistance RSLjU of the source line SLj on the second region 21-2 side are as follows.

$RSLjL = R(SL)/d \times (N-i+1)$ $RSLjU = R(SL)/d \times i$

However, R(SL) is the wiring resistance per unit length of the source line SL, and d is the source line pitch. Accordingly, the total wiring resistance RSLtotal is as follows.

$RSLtotal = RSLjL + RSLjU = R(SL)/d \times (N+1)$

That is, the wiring resistance of the source line SL also becomes constant regardless of the positions of the two selected word lines WL. This also applies to the reference source line RSL.

As described above, according to this embodiment, in the mode (2T-2R(B)) in which data is stored by the plurality of memory cells MC connected to the plurality of word lines WL, the sum of the wiring resistances of the bit lines BL from the sense amplifier 23A to each memory cell MC is always substantially constant regardless of the address. In other words, the wiring resistances of the selected bit line BL and the selected source line SL in the current path through which the cell current Icell flows can be made substantially constant regardless of the address. As a result, the data read operation can be stabilized and speeded up, the operating conditions can be relaxed, and power consumption can be reduced.

Second Embodiment

Next, a memory device according to the second embodiment of the present disclosure will be described. This embodiment is obtained by applying the first embodiment described above to a case where data is held by a set of four memory cells MC selected by two word lines WL and two bit lines BL. Hereinafter, such an operation mode is referred to as a 4T-4R mode. Only the points different from the first embodiment will be described below.

<<Configuration>>

First, a concept of 4T-4R mode will be described with reference to FIG. 8. Similar to FIG. 2 described in the first embodiment, the first region 21-1 and the second region 21-2 are provided across the sense amplifier 23A.

Then, for example, data is stored by four memory cells MC of a first memory cell MC1 connected to the word line WLi and the bit line BLj, a second memory cell MC2 connected to the word line WL(N+i) and the bit line BLj, a third memory cell MC3 connected to the word line WLi and the bit line BL(j+1), and a fourth memory cell MC4 connected to the word line WL(N+i) and the bit line BL(j+1). In this case, the memory cells MC1 and MC2 hold the same data (for example, "1"), and the memory cells MC3 and MC4 hold complementary data (for example, "0") of the memory cells MC1 and MC2, respectively.

Figure 9:
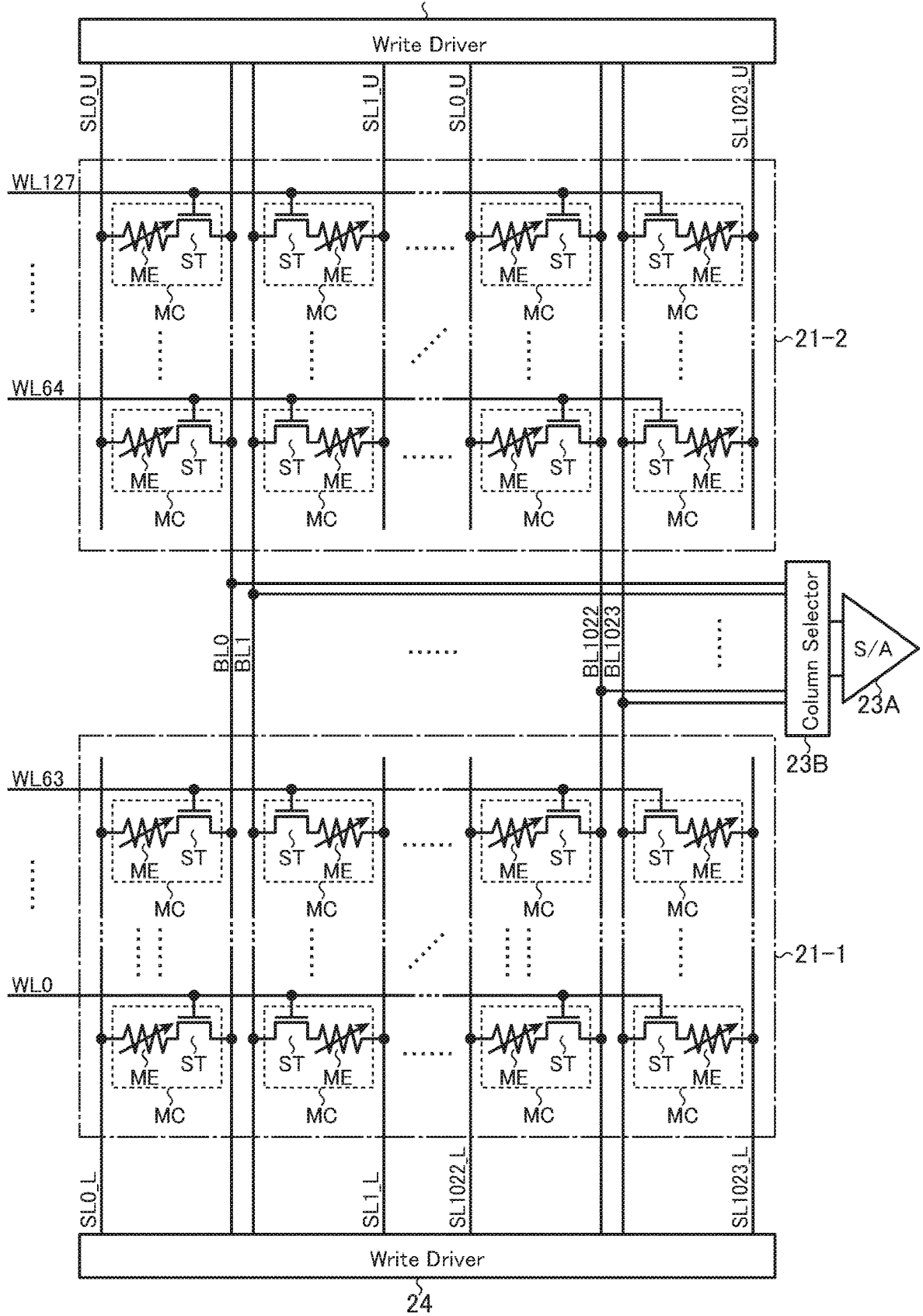
FIG. 9 is a circuit diagram of a memory cell array according to the second embodiment of the present disclosure.

FIG. 9 is a circuit diagram of a partial region of the memory cell array 21 according to this embodiment. As illustrated, the memory cell array 21 has a configuration in which the reference cell RC in FIG. 3 described in the first embodiment is omitted. Other points are the same as those in FIG. 3.

<<Operation>>

Next, a method of reading data in the 4T-4R mode according to this embodiment will be described. This embodiment is different from FIG. 5 described in the first embodiment in the following points.

In step S11, two bit lines (for example, BLj and BL(j+1)) connected to the memory cells MC holding complementary data are selected.

In step S13, the potentials of the bit lines BLj and BL(j+1) selected in step S11 are transferred to the sense amplifier 23A.

Other points are the same as in the first embodiment.

<<Effects of this Embodiment>>

According to this embodiment, data read reliability can be further improved while obtaining the same effect as that of the first embodiment.

Figure 10:
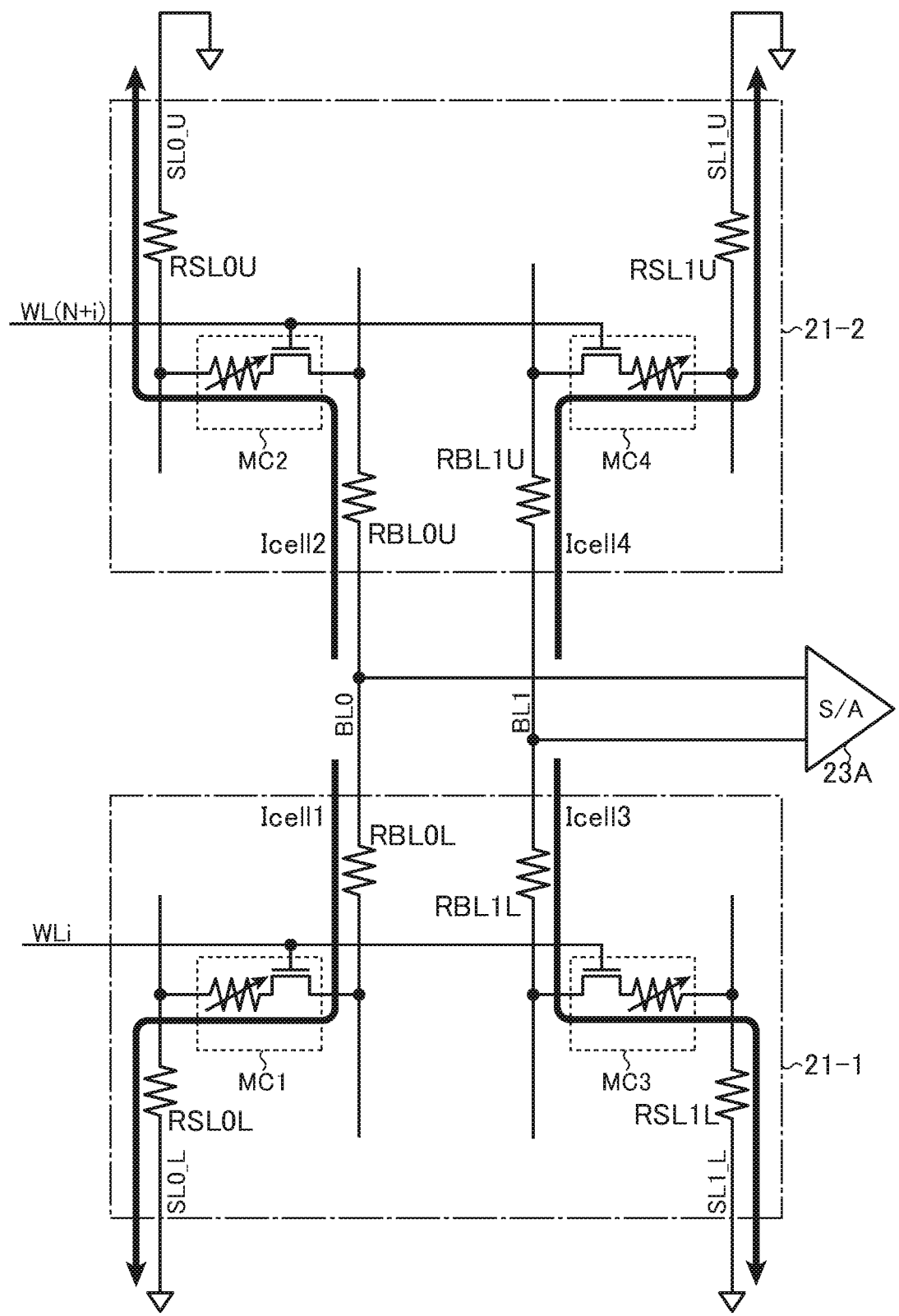
FIG. 10 is a conceptual diagram of a current path during a data read operation according to the second embodiment of the present disclosure.

FIG. 10 is a schematic diagram illustrating the cell currents Icell1 to Icell4 flowing through the selected memory cells MC and the wiring resistance when the bit lines BL0 and BL1 and the word lines WLi and WL(N+i) are selected, and corresponds to FIG. 7 described in the first embodiment. Also in this embodiment, both the wiring resistance RBLtotal of the bit lines BL0 and BL1 and the wiring resistance RSLtotal of the source lines SL0 and SL1 are as follows.

$$RBLtotal = RBL0L + RBL1U = R(BL)/d \times (N+1)$$

$$RSLtotal = RSL0L + RSL1U = R(SL)/d \times (N+1)$$

Accordingly, as described in the first embodiment, even in the 4T-4R mode, the wiring resistance of the selected bit line BL and the selected source line SL in the current path through which the cell current Icell flows can be made substantially constant regardless of the address. That is, the parasitic resistance in the current path from the sense amplifier 23A to the write driver 24 via the selected memory cell MC can be averaged between row addresses.

In the 4T-4R mode, the difference (or potential difference) in the amount of current flowing through the two bit lines BL (which may be referred to as complementary bit lines) connected to the memory cells MC holding complementary data is approximately twice the difference (or potential difference) in the amount of current flowing through the selected bit line BL and the reference bit line RBL when the reference cell RC is used. Therefore, the read reliability can be further improved.

In this embodiment, the case where the two memory cells MC connected to the adjacent bit lines hold the complementary data of each other is described. However, the memory cells MC holding complementary data may not be adjacent to each other.

Third Embodiment

Next, a memory device according to the third embodiment of the present disclosure will be described. This embodiment relates to a case where the number of word lines in one of the memory cell regions provided on both sides of the sense amplifier 23A is different from that in the first embodiment. Only the points different from the first embodiment will be described below.

<<Configuration>>

Figure 11:
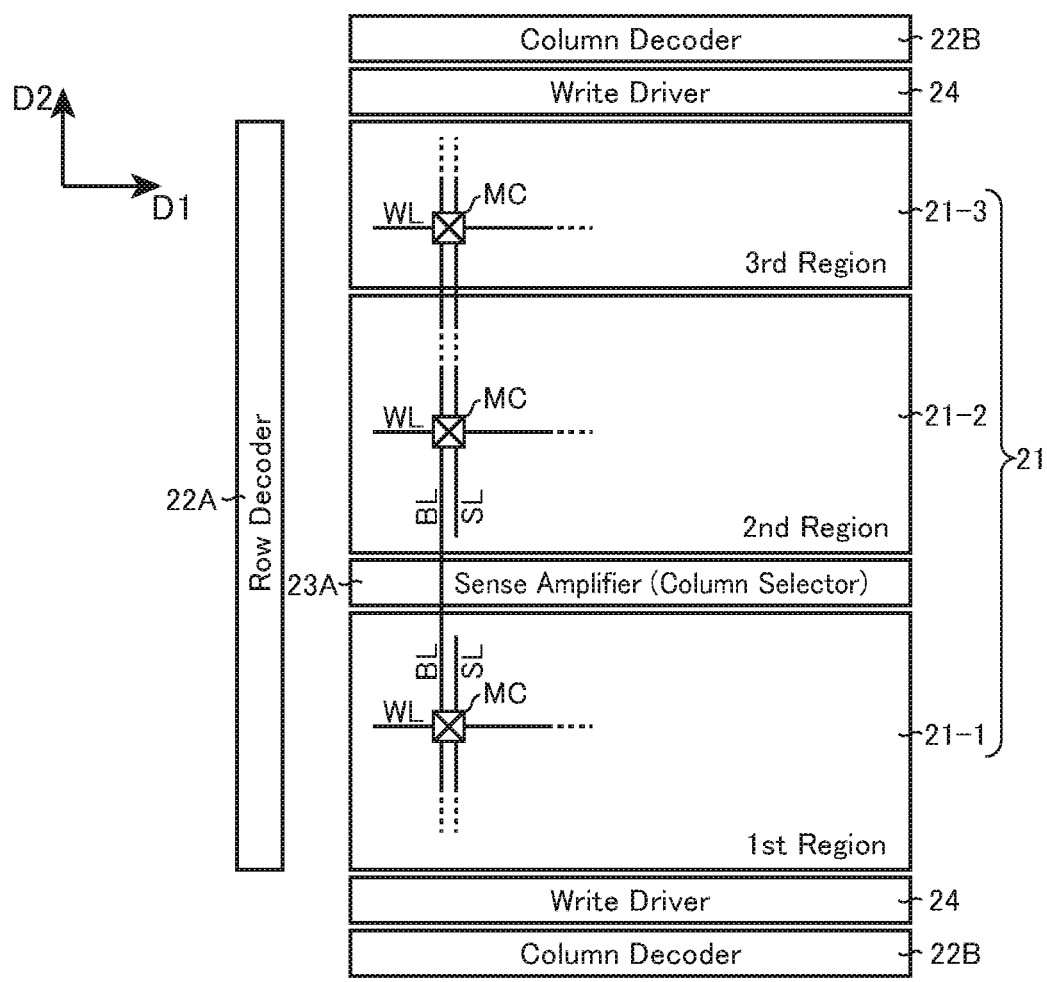
FIG. 11 is a layout diagram of a partial region of a memory device according to a third embodiment of the present disclosure.

FIG. 11 illustrates a planar layout of the memory cell array 21, the row decoder 22A, the column decoder 22B, the sense amplifier 23A, and the write driver 24 according to this embodiment, and corresponds to FIG. 2 described in the first embodiment.

As illustrated, the memory cell array 21 according to this embodiment further includes a third region 21-3 in FIG. 2 described in the first embodiment. The third region 21-3 includes a plurality of memory cells MC and reference cells RC, and is provided between the second region 21-2 and the write driver 24. Then, each bit line BL is commonly connected among the first region 21-1, the second region 21-2, and the third region 21-3. Each source line SL is commonly connected to the second region 21-2 and the third region 21-3.

Figure 12:
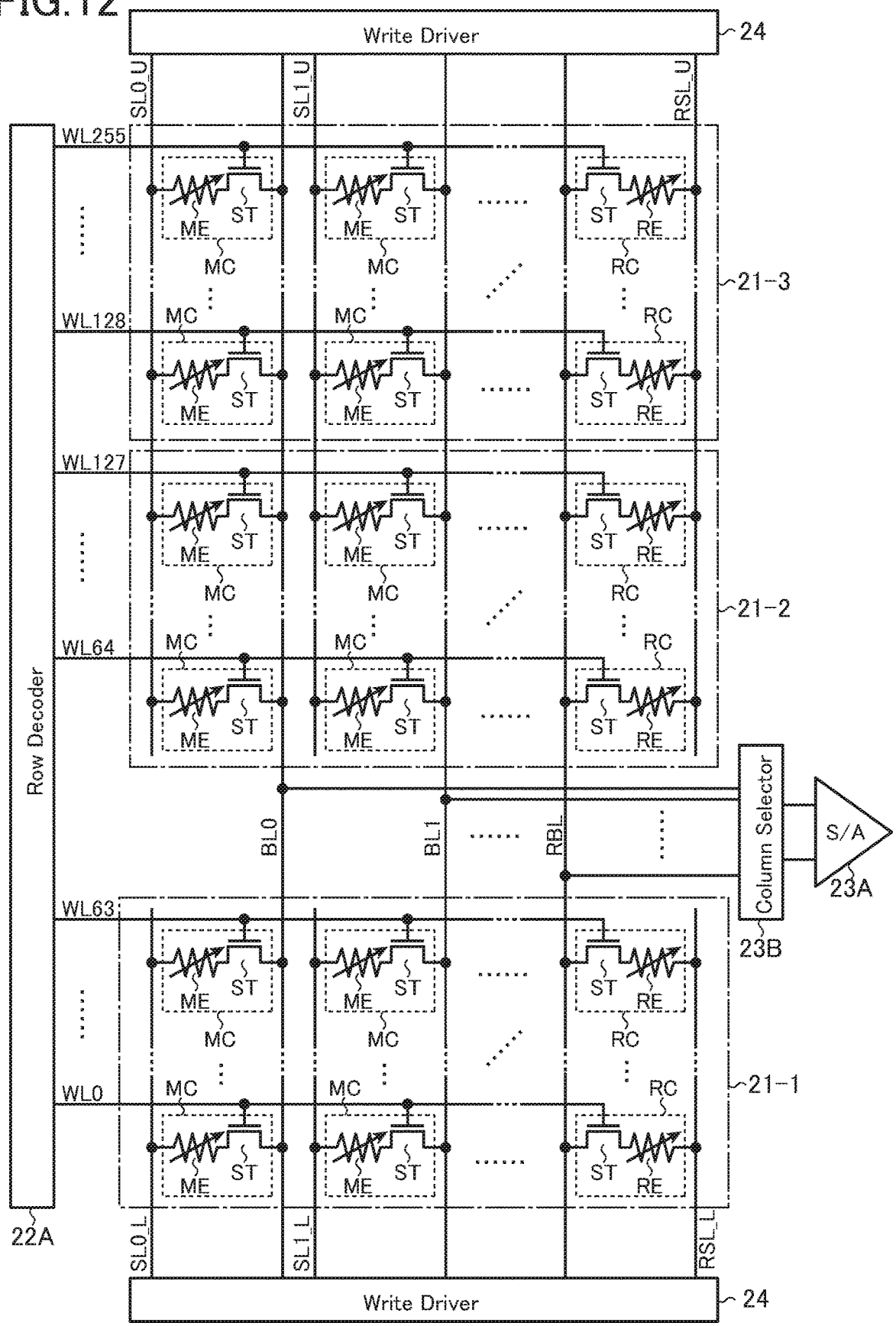
FIG. 12 is a circuit diagram of a memory cell array according to the third embodiment of the present disclosure.

FIG. 12 is a circuit diagram of a partial region of the memory cell array 21 according to this embodiment, and corresponds to FIG. 3 described in the first embodiment. As illustrated, the third region 21-3 of the memory cell array 21 includes a plurality of memory cells MC arranged in a matrix. The third region 21-3 includes M (M is a natural number of 1 or more, 128 in this example) word lines WL, and L bit lines BL and source lines SL.

Then, in the third region 21-3, gates of the select transistors ST of the memory cells MC in the same row are commonly connected to the same word lines WL128 to WL255. Drains of the select transistors ST of the memory cells MC in the same column are commonly connected to the same bit lines BL0 to BL1023. Furthermore, the other ends of the memory elements ME of the memory cells MC in the same column are commonly connected to the same source lines SL0 to SL1023.

Furthermore, the third region 21-3 includes the reference bit line RBL and the reference source line RSL. Then, M reference cells RC are respectively connected to the word lines WL128 to WL255, the drains of the select transistors ST are commonly connected to the reference bit line RBL, and the other ends of the reference elements RE are commonly connected to the reference source line RSL. Accordingly, in the examples of FIGS. 11 and 12, it can be considered that the number of word lines WL in the second region 21-2 is increased to (N+M).

In this example, a case where the third region 21-3 is provided adjacent to the second region 21-2 and the second and third regions 21-2 and 21-3 are driven by the same write driver 24 is described as an example. However, the third region 21-3 may be provided adjacent to the first region 21-1. In this case, the first and third regions 21-1 and 21-3 are driven by the same write driver 24.

<<Operation>>

Figure 13:
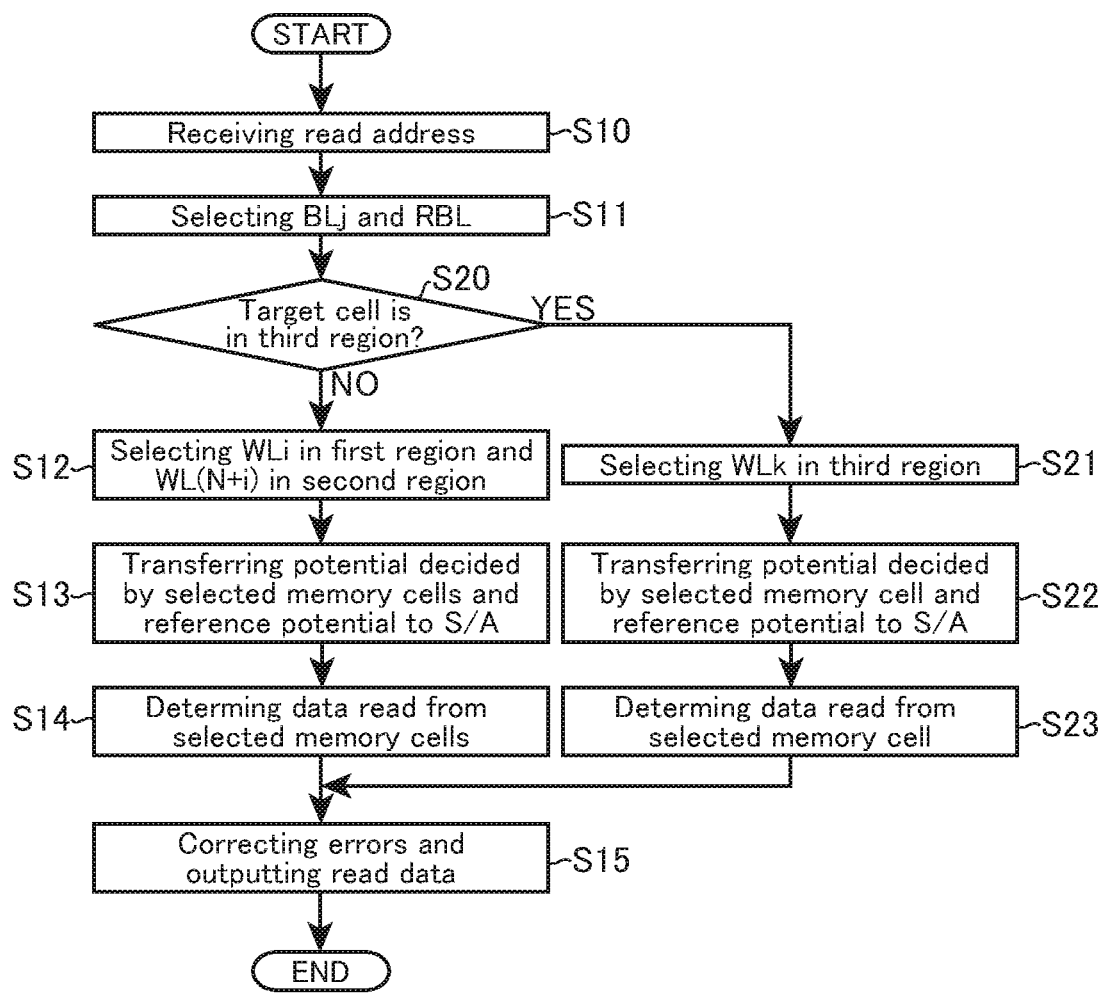
FIG. 13 is a flowchart of a data read operation according to the third embodiment of the present disclosure.

Next, a method of reading data according to this embodiment will be described. FIG. 13 is a flowchart of a data read operation according to this embodiment, and corresponds to FIG. 3 described in the first embodiment.

As illustrated, when the memory cell MC in the third region 21-3 is not a read target, that is, when the first region 21-1 or the second region 21-2 is accessed (NO in step S20), processing in step S12 and subsequent steps described in the first embodiment is executed. That is, the data read operation in the 2T-2R(B) mode is executed.

On the other hand, when the memory cell MC in the third region 21-3 is the read target (YES in step S20), the row decoder 22A selects any one word line WLk in the third region 21-3 (step S21). k is a natural number between 2N and (2N+(M−1)).

Then, the selected bit line BLj and the reference bit line RBL are charged, and a current flows through the selected bit line BLj and the reference bit line RBL. Then, the potential determined by the current flowing through the selected bit line BLj and the reference bit line RBL is transferred to the sense amplifier 23A (step S22). Then, the sense amplifier 23A determines whether the data held in the selected memory cell MC is "0" or "1" based on the potentials of the selected bit line BLj and the reference bit line RBL (step S23). After that, processing in step S15 is performed.

Figure 14:
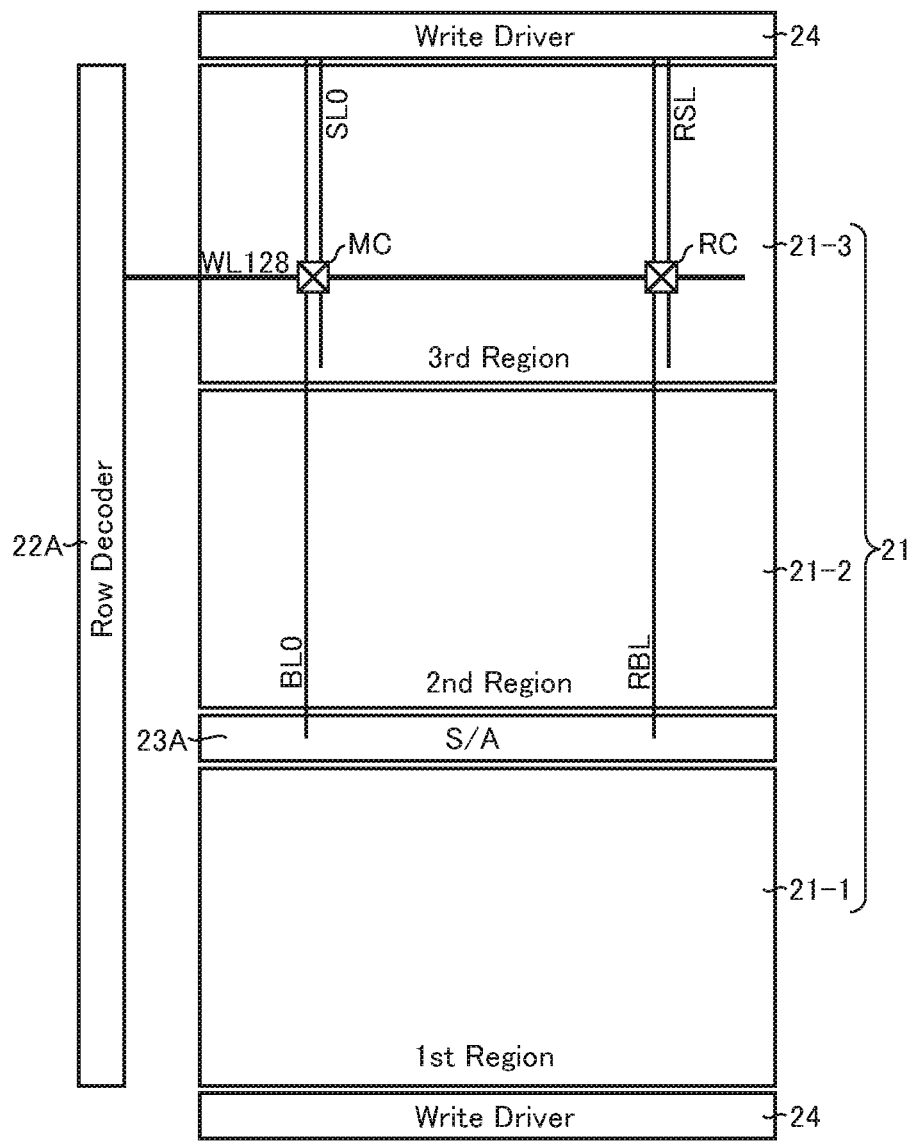
FIG. 14 is a conceptual diagram illustrating how a word line is selected during the data read operation according to the third embodiment of the present disclosure.

The state of step S21 is illustrated in FIG. 14. FIG. 14 is a block diagram of a partial region of the memory device 20, and particularly focuses on the selected word line WLk, the selected bit line BLj, the selected source line SLj, the reference bit line RBL, and the reference source line RSL.

The example of FIG. 14 illustrates a case where the bit line BL0 is selected and the word line WL128 is further selected in the third region 21-3. In this case, the word line WL is not selected in the first region 21-1 and the second region 21-2. That is, data is read to the bit line BL0 from one memory cell MC connected to the bit line BL0 and the word line WL128. In parallel with this, data is read to the reference bit line RBL from one reference cell RC connected to the reference bit line RBL and the word line WL128. Hereinafter, such an operation mode is referred to as a 1T-1R mode.

<<Effects of this Embodiment>>

According to this embodiment, even when the region 21-1 having N word lines WL and the regions 21-2 and 21-3 having (N+M) word lines WL are provided on both sides of the sense amplifier 23A, the first embodiment can be applied to the regions (first region 21-1 and second region 21-2 in this example) that can operate in the 2T-2R(B) mode.

Various usage methods can be applied to the third region 21-3. In this embodiment, the case where the 1T-1R mode is applied is described as an example, but is not limited thereto.

Fourth Embodiment

Next, a memory device according to the fourth embodiment of the present disclosure will be described. This embodiment relates to the case where the number of word lines in the memory cell regions provided on both sides of the sense amplifier 23A is different from that in the second embodiment. That is, this embodiment corresponds to a combination of the second embodiment and the third embodiment. Only the points different from the second and third embodiments will be described below.

<<Configuration>>

Figure 8:
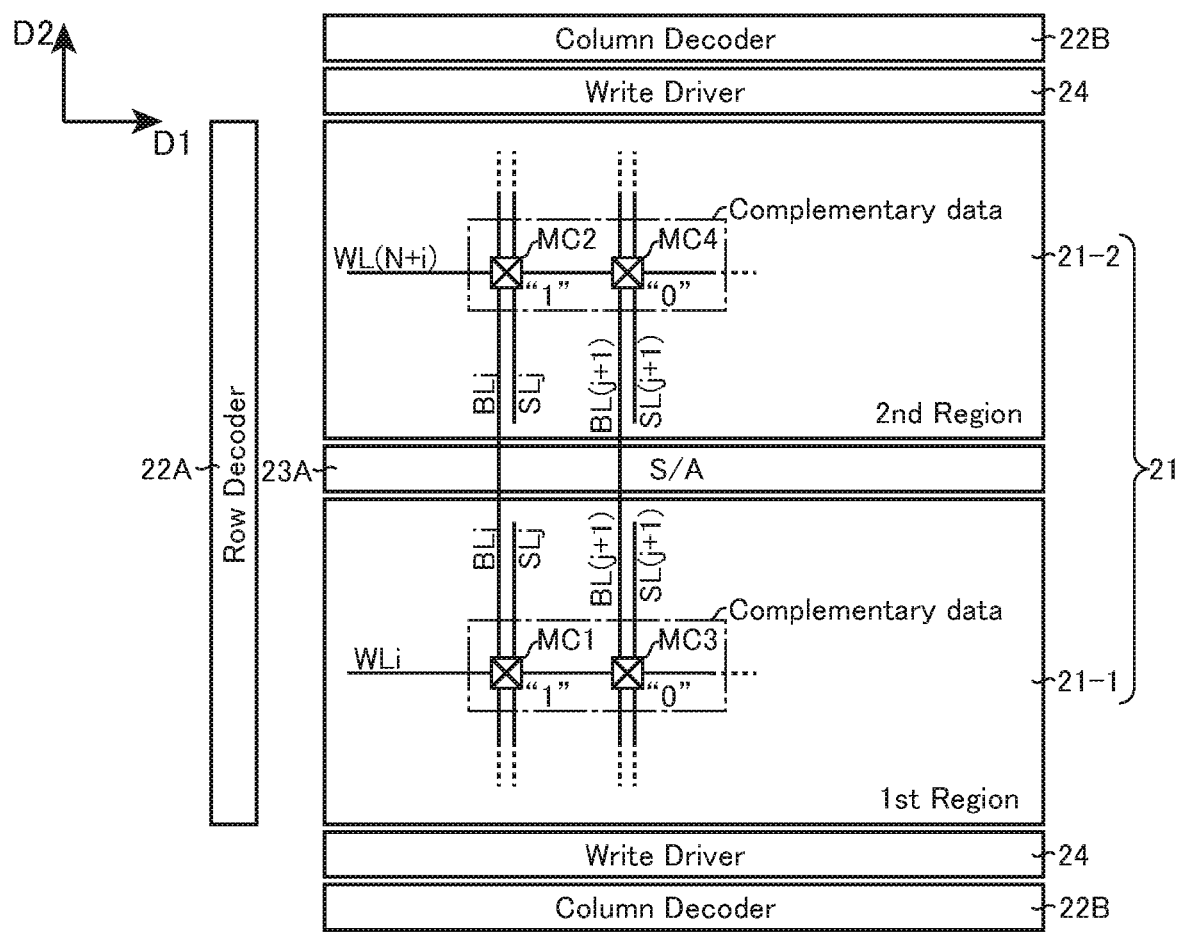
FIG. 8 is a layout diagram of a partial region of a memory device according to a second embodiment of the present disclosure.

In the memory cell array 21 according to this embodiment, in FIG. 8 described in the second embodiment, the third region 21-3 for holding data by two memory cells MC connected to complementary bit lines is provided between the second region 21-2 and the write driver 24. Others are as described with reference to FIG. 11 in the third embodiment.

Figure 15:
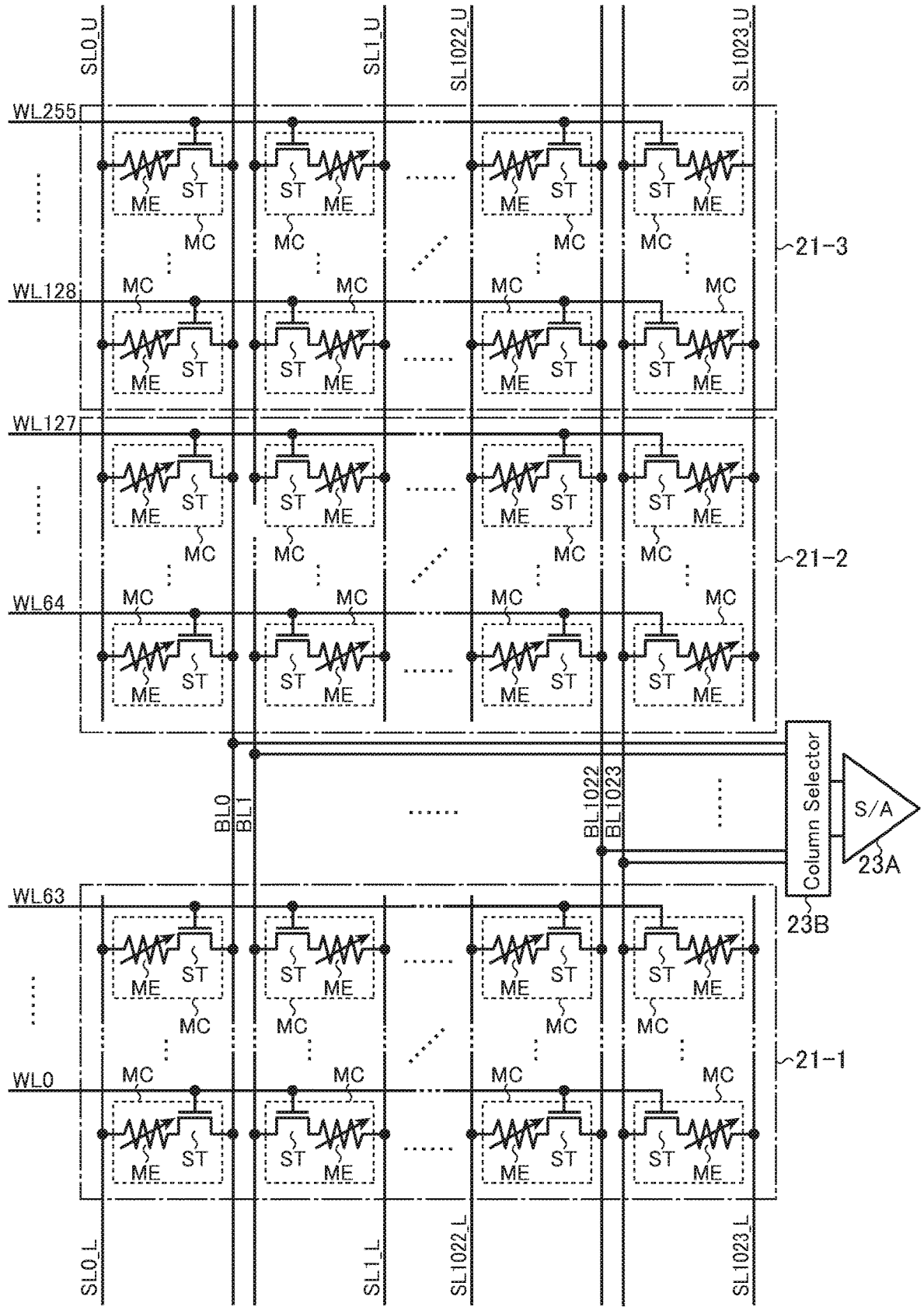
FIG. 15 is a circuit diagram of a memory cell array according to a fourth embodiment of the present disclosure.

FIG. 15 is a circuit diagram of a partial region of the memory cell array 21 according to this embodiment, and corresponds to FIG. 12 described in the third embodiment. As illustrated, the third region 21-3 of the memory cell array 21 includes a plurality of memory cells MC arranged in a matrix. The third region 21-3 includes M word lines WL, L bit lines BL, and L source lines SL, similarly as in the third embodiment.

Then, in the third region 21-3, gates of the select transistors ST of the memory cells MC in the same row are commonly connected to the same word lines WL128 to WL255. Drains of the select transistors ST of the memory cells MC in the same column are commonly connected to the same bit lines BL0 to BL1023. Furthermore, the other ends of the memory elements ME of the memory cells MC in the same column are commonly connected to the same source lines SL0 to SL1023. That is, in FIG. 9 described in the second embodiment, it can be considered that the number of word lines WL in the second region 21-2 is increased from N to (N+M).

Also in this example, the third region 21-3 may be provided adjacent to the first region 21-1. In this case, the first and third regions 21-1 and 21-3 are driven by the same write driver 24.

<<Operation>>

Next, a method of reading data according to this embodiment will be described. A data read operation according to this embodiment is as illustrated in FIG. 13 described in the third embodiment. The difference from FIG. 13 is that two complementary bit lines BLj and BL(j+1) are selected when reading data from the third region 21-3. That is, as described in the second embodiment, data is read to the bit line BLj from the memory cell MC connected to the word line WLk in the third region 21-3, and complementary data for the data read to the bit line BLj is read to the bit line BL (j+1). Hereinafter, such an operation mode is referred to as a 2T-2R mode.

<<Effects of this Embodiment>>

According to this embodiment, even when the region 21-1 having N word lines WL and the regions 21-2 and 21-3 having (N+M) word lines WL are provided on both sides of the sense amplifier 23A, the second embodiment can be applied to the regions (the first region 21-1 and the second region 21-2 in this example) that can operate in the 4T-4R mode.

Various usage methods can be applied to the third region 21-3. In this embodiment, the case where the 2T-2R mode is applied is described as an example, but is not limited thereto.

Fifth Embodiment

Next, a memory device according to the fifth embodiment of the present disclosure will be described. This embodiment relates to a configuration in which the operation modes described in the first to fourth embodiments can be appropriately selected. Only the points different from the first to fourth embodiments will be described below.

Figure 16:
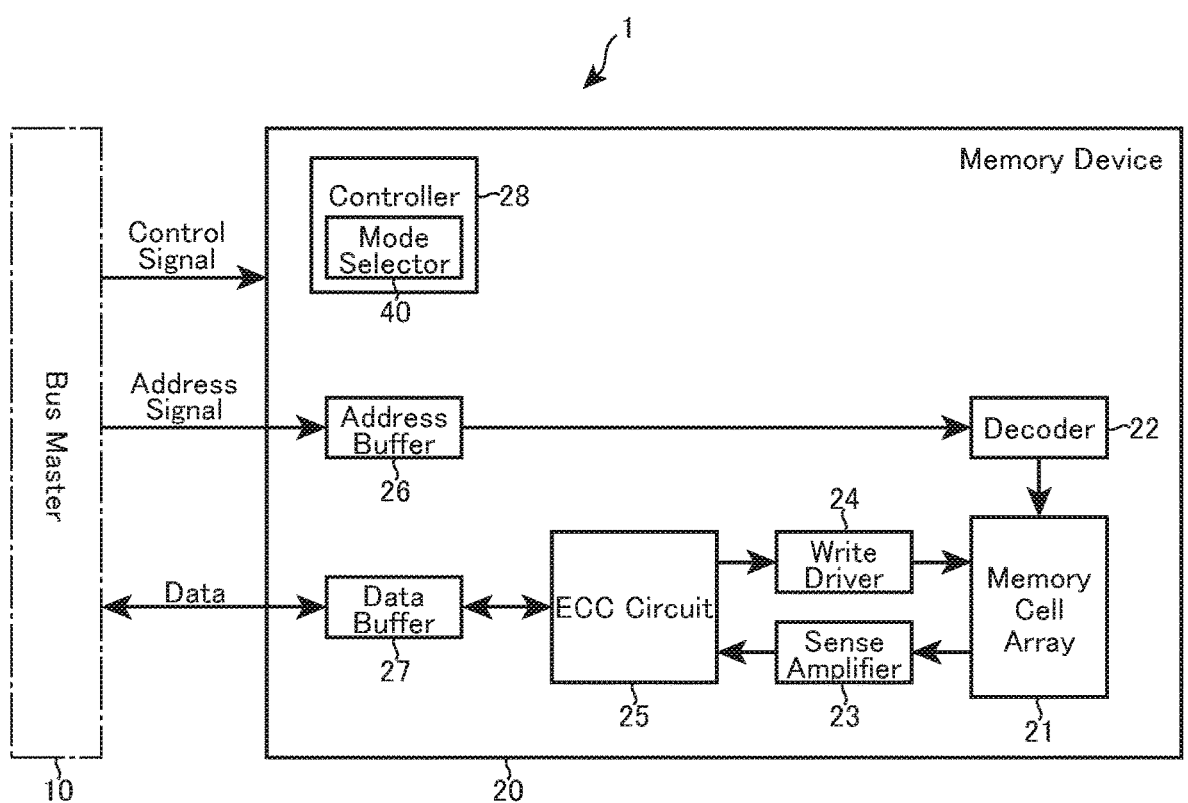
FIG. 16 is a block diagram of a processor system according to a fifth embodiment of the present disclosure.

FIG. 16 is a block diagram of the processor system 1 according to this embodiment. The difference from FIG. 1 described in the first embodiment is that the controller 28 includes a mode selector 40. The mode selector 40 may not be a part of the controller 28, and may be realized by separate hardware or software. The mode selector 40 changes the access mode to the memory cell array 21. That is, the memory device 20 according to this embodiment can operate in the following operation modes described in the first to fourth embodiments.

---
1T-1R mode
2T-2R(B) mode
2T-2R mode
4T-4R mode
---

The configuration of the memory cell array 21 is as described in FIG. 3 or FIG. 12. When the 1T-1R mode and the 2T-2R mode are not used, the configuration illustrated in FIG. 9 or 15 may be adopted.

When the mode selector 40 selects any one of the modes, information to that effect is transferred to the decoder 22, the sense amplifier 23, and the write driver 24. Then, each circuit unit operates in the selected mode, as described in the first to fourth embodiments.

<<Effects of this Embodiment>>

According to this embodiment, the operation mode can be appropriately selected by the mode selector 40. Generally, the larger the number of memory cells serving as a unit of stored information, the more advantageous in terms of high-speed operation and high reliability, but the larger the chip area. For example, it is conceivable that the 1T-1R mode is used for ROM use, the 2T-2R mode is used for L2 cache use, and the 4T-4R is used for L1 cache use. In this respect, according to this embodiment, a memory that can switch these modes seamlessly can be realized.

The mode selector 40 may receive, for example, a mode signal from the bus master 10 and select the operation mode based on the mode signal. That is, the bus master 10 may transmit an operation request for any of the 1T-1R mode, the 2T-2R(B) mode, the 2T-2R mode, and the 4T-4R mode to the memory device 20, and the memory device 20 may receive the operation request accordingly.

Alternatively, for example, information about the operation mode may be stored in any region of the memory cell array 21. Then, when the memory device 20 is powered on, this information may be read into a mode register or the like (not illustrated), and the mode selector 40 may select the operation mode based on the read information.

Modification Example or the Like

As described above, according to the memory devices according to the first to fourth embodiments, operation reliability can be improved. Although the description as above is made using various embodiments, the embodiments are not limited to those described above, and various modifications may be made thereto.

Figure 17A:
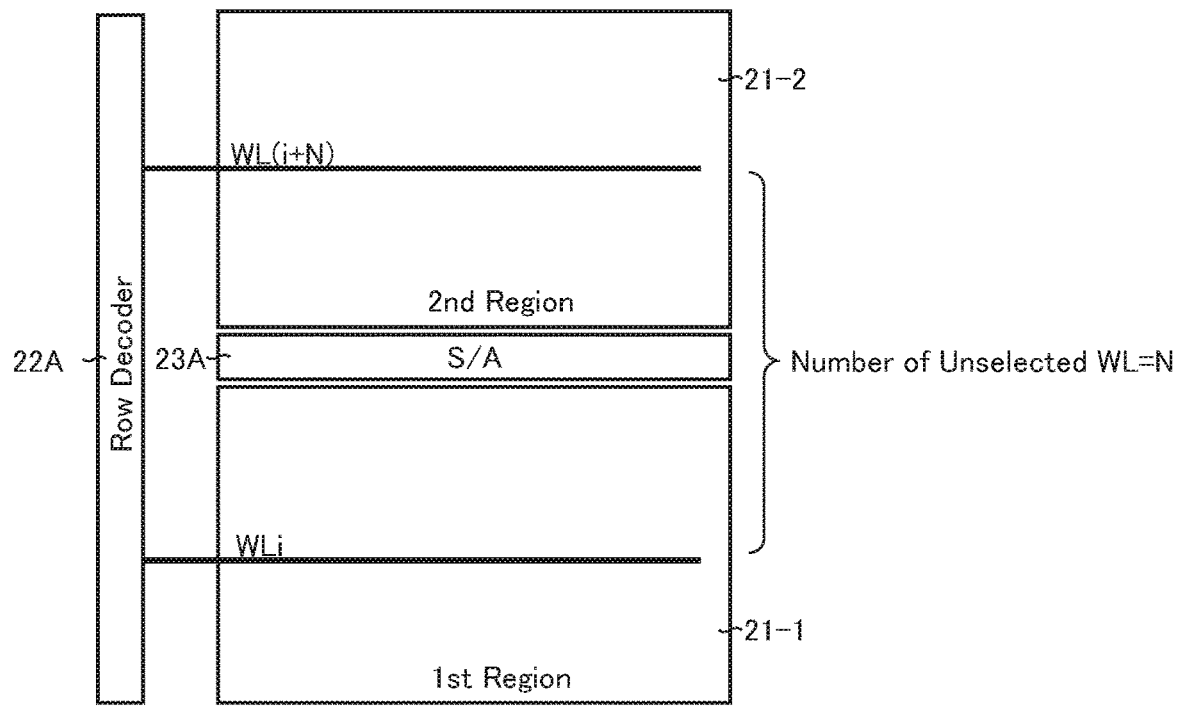
FIG. 17A is a conceptual diagram illustrating how a word line is selected during the data read operation according to the first to fifth embodiments of the present disclosure.

FIG. 17A is a conceptual diagram of the method of selecting the two word lines WL described in the embodiments described above. As illustrated, when the word line WLi is selected in the first region 21-1, the word line WL(N+i) is selected in the second region 21-2. That is, N unselected word lines WL are present (=exist) between the two selected word lines WLi and WL(N+i). However, the number of unselected word lines WL exist between the two selected word lines WL may not be N. For example, the unselected word line WL existing between the two selected word lines WLi and WL(N+i) may include a dummy word line WL. In this case, the number of unselected word lines WL is larger than N.

Figure 17B:
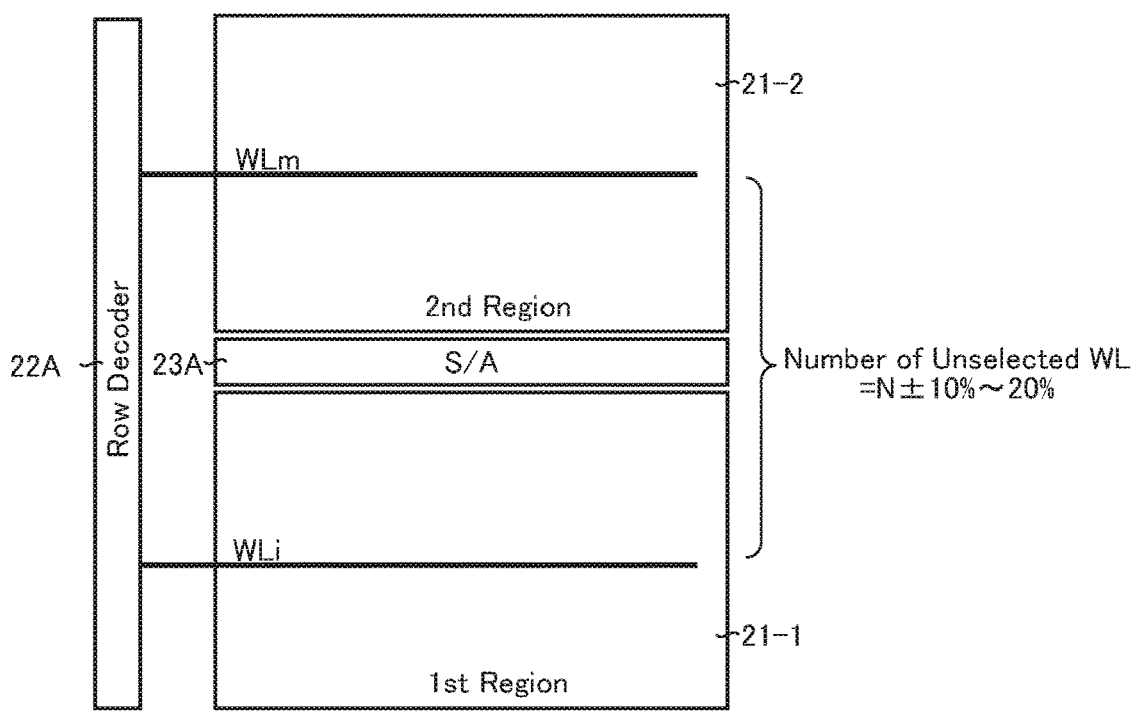
FIG. 17B is a conceptual diagram illustrating how a word line is selected during a data read operation according to a first modification example of the first to fifth embodiments of the present disclosure.

Further, for example, the number of unselected word lines WL existing between the two selected word lines WLi and WL(N+i) may not always be N. This state is illustrated in FIG. 17B. That is, the number of unselected word lines WL allows a deviation within a certain range from N. In the example of FIG. 17B, a case where the number of unselected word lines WL between the two selected word lines WLi and WLm (m is a natural number between N and (2N−1)) may differ from N, for example, in the range of 10% to 20%, depending on the set of selected word lines WL, is illustrated. In other words, in the case where the number of the two selected word lines WL is within a predetermined range, for example, N=64, it suffices that the number of unselected word lines WL may be within a range of 58 to 70 of plus or minus 10%. How much deviation is allowed is different for each application, and thus it suffices that the number of unselected word lines WL may be appropriately set according to the demanded request. That is, no matter which row address is selected, it suffices that the influence of the resistance value in the path of the cell current (and the reference current) from the bit line BL to the source line SL can be averaged, and the degree of averaging can be set variously. The influence of the resistance value may not be averaged. That is, when two word lines WL are selected during the data read operation, it is sufficient that only one word line WL is selected from one of the two regions 21-1 and 21-2 positioned with the sense amplifier 23A in between and one word line WL is selected from the other.

Figure 18A:
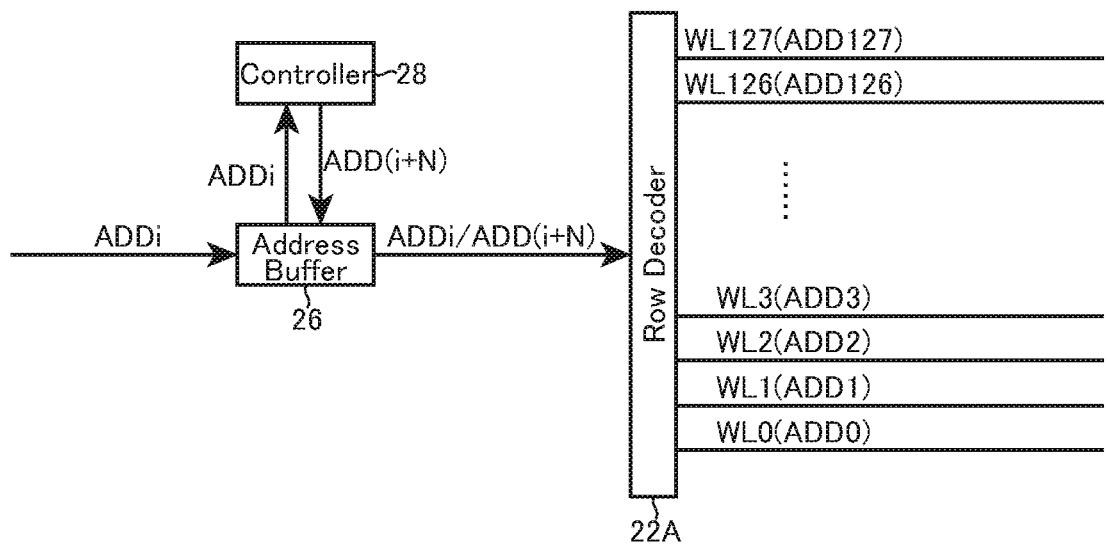
FIG. 18A is a conceptual diagram of a row address assigning method according to a second modification example of the first to fifth embodiments of the present disclosure.

Further, a method of assigning an address to the word line WL can be selected as appropriate. FIG. 18A illustrates a first example of the word line address assigning method. In the example of FIG. 18A, unique physical addresses ADD0 to ADD127 are assigned to the word lines WL0 to WL127 in the first region 21-1 and the second region 21-2, respectively. Then, when the bus master 10 transmits one address ADDi, the controller 28 of the memory device 20, for example, generates an address ADD(i+N) and stores the address ADD(i+N) in the address buffer 26. Then, the addresses ADDi and ADD(i+N) are transmitted to the decoder 22. The controller 28 may hold the value of N in a calculation formula of (i+N) in any one of the registers and use the value to perform the calculation of (i+N). Alternatively, the correspondence relationship between the addresses ADD may be stored in advance as a table. For example, the following table may be maintained.

---
ADD0: ADD64
ADD1: ADD65
ADD2: ADD66
ADD3: ADD67
...
ADD63: ADD127
---

Then, for example, when the address ADD0 is received from the bus master 10, the controller 28 selects the address ADD64 corresponding to the address ADD0 and transmits the address ADD64 to the address buffer 26. This processing may be performed by the row decoder 22A instead of the controller 28.

Figure 18B:
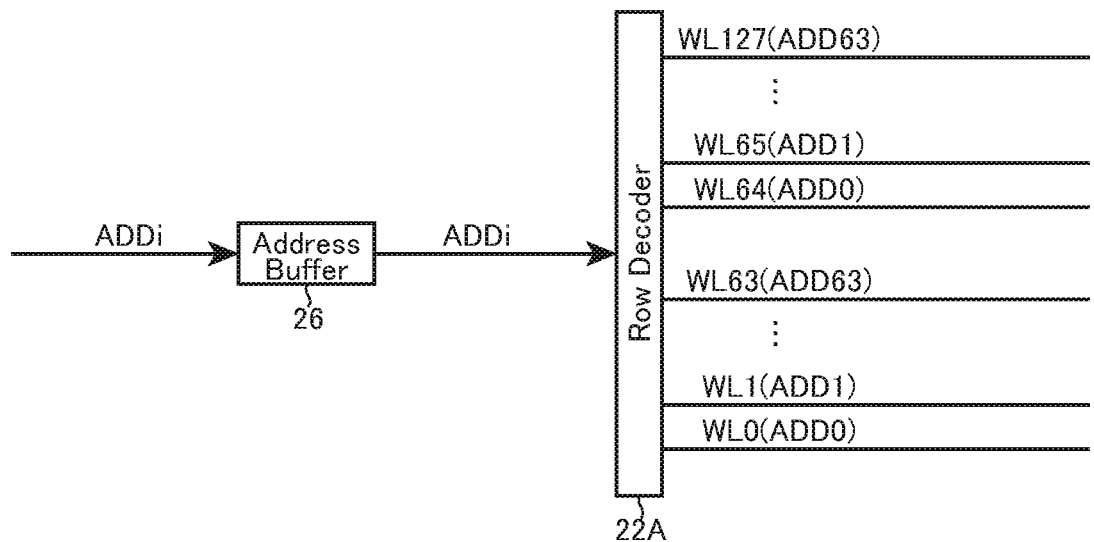
FIG. 18B is a conceptual diagram of a row address assigning method according to a third modification example of the first to fifth embodiments of the present disclosure.

FIG. 18B relates to a second word line address assigning method. In the second method, the same addresses may be assigned to the word lines WL0 to WL63 in the first region 21-1 and the word lines WL64 to WL127 in the second region 21-2, respectively. That is, the address ADD0 is assigned to the word lines WL0 and WL64, and the address ADD1 is assigned to the word lines WL1 and WL65. In this case, the two word lines WL can be selected by decoding only the address received from the bus master 10.

Figure 19:
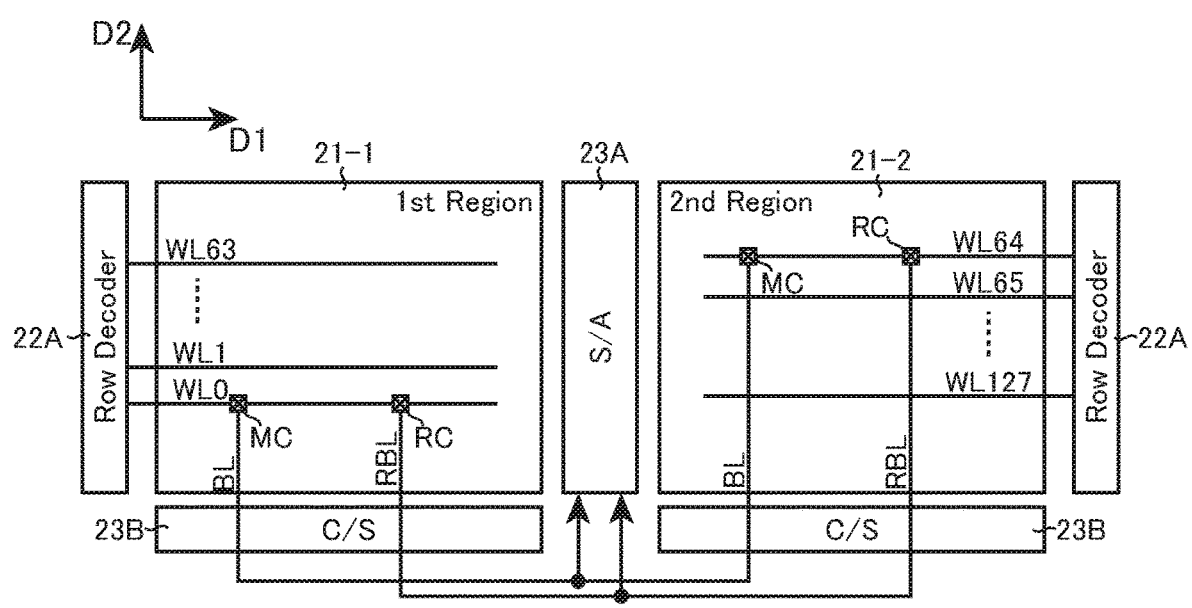
FIG. 19 is a layout diagram of a partial region of a memory device according to a fourth modification example of the first to fifth embodiments of the present disclosure.

The planar layout of the memory cell array 21 and the sense amplifier 23 is not limited to that illustrated in FIG. 2. For example, an example of FIG. 19 may be used. In the example of FIG. 19, the sense amplifier 23A is provided between the first region 21-1 and the second region 21-2 in the first direction, not the second direction. Even in this case, the bit line lengths of the two memory cells MC selected by the two word lines WL can be made substantially constant regardless of the address. For example, in the example of FIG. 19, the word line WL0 in the first region 21-1 selects the memory cell MC closest to the column selector 23B and the sense amplifier 23A. On the other hand, in the second region 21-2, the word line WL64 selects the memory cell MC farthest from the column selector 23B and the sense amplifier 23A.

Further, in the embodiments described above, MRAM is taken as an example of the memory device 20 for description. However, the memory is not limited to the MRAM, and may be, for example, ReRAM, PCRAM, or other non-volatile memory. In the case of ReRAM, resistance change elements whose electric resistance changes due to a field-induced colossal resistance changing effect are used as the memory element ME and the reference element RE. In the case of PCRAM, phase change elements that change a phase state of a phase change material due to Joule heat generated when a current is applied to rewrite data are used as the elements ME and RE. When these elements are used, the reading unit and the writing unit of the read/write circuit may have a circuit configuration according to the element to be used, and known circuit configurations can be used for the reading unit and the writing unit.

In the embodiments described above, although the case where the memory cell MC is formed of one select transistor and one data storage element is described as an example, the present disclosure is not limited to such a form.

In the embodiments described above, although the processor system 1 is described as an example, a memory system may be used instead of the processor system 1, for example. In this case, the memory device 20 may be a memory for storage, and the bus master 10 may be a host device such as a personal computer or a digital camera.

While there have been described what are at present considered to be certain embodiments of the invention, it will be understood that various modifications may be made thereto, and it is intended that the appended claim cover all such modifications as fall within the true spirit and scope of the invention.

It should be understood by those skilled in the art that various modifications, combinations, sub-combinations and alterations may occur depending on design requirements and other factors insofar as they are within the scope of the appended claims or the equivalents thereof.

What is claimed is:

1. A memory device comprising:
a cell array that includes a first region including a plurality of first memory cells and a second region including a plurality of second memory cells;
a plurality of first word lines connected to each of the plurality of first memory cells;
a plurality of second word lines connected to each of the plurality of second memory cells;
a first bit line commonly connected to the plurality of first memory cells and the plurality of second memory cells;
a row decoder that selects one of the first word lines and one of the second word lines in parallel in accordance with a row address during a data read operation; and
a sense amplifier provided between the first region and the second region and electrically connected to the first bit line during the data read operation.

2. The memory device according to claim 1,
wherein the plurality of first word lines and the plurality of second word lines are respectively provided along a first direction,
the first bit line is provided along a second direction different from the first direction, and
the sense amplifier is provided between the first region and the second region in the second direction.

3. The memory device according to claim 2,
wherein the row decoder selects one of the first word lines and one of the second word lines in parallel so that the number of the first word lines and the second word lines between the one of the first word lines and the one of the second word lines selected in accordance with a first row address and the number of the first word lines and the second word lines between the one of the first word lines and the one of the second word lines selected in accordance with a second row address different from the first row address fall within a predetermined range.

4. The memory device according to claim 3,
wherein the row decoder selects the one of the first word lines and the one of the second word lines such that path lengths of the first bit line on a path from one of the first memory cells connected to the one of the first word lines and one of the second memory cells connected to the one of the second word lines to the sense amplifier are averaged between the first row address and the second row address.

5. The memory device according to claim 4,
wherein a sum of numbers of the first word lines and the second word lines between the one of the first word lines and the one of the second word lines selected in accordance with the first row address is equal to a sum of numbers of the first word lines and the second word lines between the one of the first word lines and the one of the second word lines selected in accordance with the second row address.

6. The memory device according to claim 3,
wherein, during the data read operation, the row decoder
selects an i-th one of the first word lines based on one of the first word lines farthest from the sense amplifier, in the first region, and
selects an i-th one of the second word lines based on one of the second word lines closest to the sense amplifier, in the second region, where
i is a natural number from 1 to N, and N is the number of the first word lines and the number of the second word lines and is the number of the first memory cells and the number of the second memory cells.

7. The memory device according to claim 6,
wherein the first region further includes N third memory cells respectively connected to the N first word lines,
the second region further includes N fourth memory cells respectively connected to the N second word lines,
the memory device further comprises a second bit line commonly connected to the third memory cells and the fourth memory cells,
one of the first memory cells connected to the selected one of the first word lines in the first region and one of the second memory cells connected to the selected one of the second word lines in the second region hold a same data, and
during the data read operation,
 a first read potential based on data read from the one of the first memory cells and the one of the second memory cells is transferred to the sense amplifier via the first bit line, and
 a second read potential based on data read from one of the third memory cells connected to the selected one of the first word lines and one of the fourth memory cells connected to the selected one of the second word lines is transferred to the sense amplifier via the second bit line.

8. The memory device according to claim 7,
wherein the third memory cells and the fourth memory cells are reference cells that hold reference data during the data read operation.

9. The memory device according to claim 7,
wherein the third memory cells hold complementary data for data held by the corresponding first memory cells, and
the fourth memory cells hold complementary data for data held by the corresponding second memory cells.

10. The memory device according to claim 1, further comprising:
a first source line connected to the first memory cells; and
a second source line connected to the second memory cells,
wherein the first source line and the second source line are physically separated in a region between the first region and the second region.

11. The memory device according to claim 6, further comprising:
M third word lines, where M is a natural number greater than or equal to 1,
wherein the cell array further includes a third region including M fifth memory cells connected to the third word lines and the first bit line, and
when reading data from the first region and the second region, the row decoder
 selects the i-th one of the first word lines in the first region and selects the i-th one of the second word lines in the second region, without selecting the third word lines.

12. The memory device according to claim 11,
wherein, when reading data from the third region, the row decoder selects the third word lines without selecting the N first word lines and the N second word lines.

13. The memory device according to claim 11,
wherein the first region further includes N third memory cells respectively connected to the N first word lines,
the second region further includes N fourth memory cells respectively connected to the N second word lines,
the third region further includes M sixth memory cells connected to the third word lines,
the memory device further comprises a second bit line commonly connected to the third memory cells, the fourth memory cells, and the sixth memory cells,
one of the first memory cells connected to the selected one of the first word lines in the first region and one of the second memory cells connected to the selected one of the second word lines in the second region hold a same data, and
when reading data from the first region and the second region,
 a first read potential based on data read from the one of the first memory cells and the one of the second memory cells is transferred to the sense amplifier via the first bit line, and
 a second read potential based on data read from one of the third memory cells connected to the selected one of the first word lines and one of the fourth memory cells connected to the selected one of the second word lines is transferred to the sense amplifier via the second bit line.

14. The memory device according to claim 13,
wherein in the first region and the second region, data is held by two memory cells including one of the first memory cells and one of the second memory cells, and
each of the third memory cells and the fourth memory cells is a reference cell that holds reference data during the data read operation.

15. The memory device according to claim 13,
wherein, in the first region and the second region, data is held by four memory cells including one of the first memory cells, one of the second memory cells, one of the third memory cells, and one of the fourth memory cells,
the third memory cells hold complementary data for data held by the corresponding first memory cells, and
the fourth memory cells hold complementary data for data held by the corresponding second memory cells.

16. The memory device according to claim 13,
wherein, when reading data from the third region,
the row decoder selects the third word lines without selecting the N first word lines and the N second word lines, and
a third read potential based on data read from the fifth memory cells is transferred to the sense amplifier via the first bit line, and further, a fourth read potential based on data read from the sixth memory cells is transferred to the sense amplifier via the second bit line.

17. The memory device according to claim 16,
wherein, in the third region, data is held by the fifth memory cells, and
the sixth memory cells are reference cells that hold reference data when reading data from the fifth memory cells.

18. The memory device according to claim 16,
wherein, in the third region, data is held by the fifth memory cells and the sixth memory cells, and
the sixth memory cells hold complementary data for the data held by the fifth memory cells.

19. The memory device according to claim 6,
wherein the memory device has a first mode and a second mode,
the memory device further comprises a selector that switches between the first mode and the second mode, and
during the data read operation, the row decoder selects the i-th one of the first word lines and the i-th one of the second word lines in parallel when the selector selects the first mode, and selects one of the first word lines or one of the second word lines when the selector selects the second mode.

20. The memory device according to claim 1,
wherein each of the first memory cells and the second memory cells includes a select transistor and a resistance change element.

21. The memory device according to claim 20,
wherein the memory device is one of a magnetoresistive random access memory (MRAM), a resistive random access memory (ReRAM), and a phase change random access memory (PCRAM).

22. The memory device according to claim 21,
wherein the memory device is a non-volatile memory.

* * * * *